(12) United States Patent
Han et al.

(10) Patent No.: US 10,665,557 B2
(45) Date of Patent: May 26, 2020

(54) SEMICONDUCTOR DEVICE

(71) Applicant: Samsung Electronics Co., Ltd., Suwon-si, Gyeonggi-do (KR)

(72) Inventors: Jung-Hoon Han, Hwaseong-si (KR); Sungjin Kim, Hwaseong-si (KR); Junyong Noh, Yongin-si (KR); Heonjun Lim, Seoul (KR)

(73) Assignee: Samsung Electronics Co., Ltd., Suwon-si (KR)

(\*) Notice: Subject to any disclaimer, the term of this patent is extended or adjusted under 35 U.S.C. 154(b) by 0 days.

(21) Appl. No.: 15/997,338

(22) Filed: Jun. 4, 2018

(65) Prior Publication Data

US 2019/0035750 A1    Jan. 31, 2019

(30) Foreign Application Priority Data

Jul. 26, 2017    (KR) .................... 10-2017-0094903

(51) Int. Cl.
*H01L 23/00*    (2006.01)
*H01L 23/58*    (2006.01)
(Continued)

(52) U.S. Cl.
CPC ............. *H01L 24/05* (2013.01); *H01L 21/78* (2013.01); *H01L 22/32* (2013.01); *H01L 22/34* (2013.01); *H01L 23/562* (2013.01); *H01L 23/585* (2013.01); *H01L 21/6836* (2013.01); *H01L 23/3128* (2013.01); *H01L 24/32* (2013.01);
(Continued)

(58) Field of Classification Search
CPC ....... H01L 24/05; H01L 23/585; H01L 22/32; H01L 21/78; H01L 2924/15311; H01L 2224/05548; H01L 2224/02313; H01L 2224/04042; H01L 2224/0235; H01L 2224/0233; H01L 2224/02381; H01L 2224/05558; H01L 2224/05551; H01L 2924/181; H01L 2224/32225; H01L 2224/48227; H01L 2224/73265; H01L 2924/00012
See application file for complete search history.

(56) References Cited

U.S. PATENT DOCUMENTS 6,753,608 B2    6/2004    Tomita
7,977,232 B2    7/2011    Eto
(Continued)

FOREIGN PATENT DOCUMENTS

JP    4088120 B2    5/2008
JP    5583320 B2    9/2014
(Continued)

*Primary Examiner* — Thanh T Nguyen
(74) *Attorney, Agent, or Firm* — Myers Bigel, P.A.

(57) ABSTRACT

A semiconductor device includes a semiconductor substrate having a chip region and an edge region, a lower dielectric layer on the semiconductor substrate, a chip pad on the lower dielectric layer of the chip region, an upper dielectric layer on the lower dielectric layer, which includes a first opening exposing the chip pad on the chip region and a second opening exposing the lower dielectric layer on the edge region, and a redistribution pad connected to the chip pad. The redistribution pad includes a via portion in the first opening and a pad portion extending from the via portion onto the upper dielectric layer.

18 Claims, 25 Drawing Sheets

(51) Int. Cl.
  *H01L 21/66* (2006.01)
  *H01L 21/78* (2006.01)
  *H01L 23/31* (2006.01)
  *H01L 21/683* (2006.01)

(52) U.S. Cl.
  CPC .............. *H01L 24/48* (2013.01); *H01L 24/73* (2013.01); *H01L 2221/68327* (2013.01); *H01L 2224/0233* (2013.01); *H01L 2224/0235* (2013.01); *H01L 2224/02166* (2013.01); *H01L 2224/02313* (2013.01); *H01L 2224/02381* (2013.01); *H01L 2224/04042* (2013.01); *H01L 2224/05548* (2013.01); *H01L 2224/05551* (2013.01); *H01L 2224/05558* (2013.01); *H01L 2224/32225* (2013.01); *H01L 2224/48227* (2013.01); *H01L 2224/73265* (2013.01); *H01L 2924/00014* (2013.01); *H01L 2924/13091* (2013.01); *H01L 2924/14* (2013.01); *H01L 2924/15184* (2013.01); *H01L 2924/15311* (2013.01); *H01L 2924/181* (2013.01)

(56) References Cited

U.S. PATENT DOCUMENTS

| | | | |
|---|---|---|---|
| 8,841,753 | B2 | 9/2014 | Takemura et al. |
| 9,105,706 | B2 | 8/2015 | Otsuka |
| 9,443,808 | B2 | 9/2016 | Nakamura et al. |
| 2006/0079025 | A1 | 4/2006 | Kripesh |
| 2008/0128904 | A1 | 6/2008 | Sakamoto |
| 2014/0027872 | A1 | 1/2014 | Yu |
| 2014/0048926 | A1 | 2/2014 | Wang |
| 2017/0018512 | A1 | 1/2017 | Tomita |
| 2017/0117253 | A1* | 4/2017 | Yu .......................... H01L 24/25 |
| 2017/0200661 | A1 | 7/2017 | Lee |
| 2018/0261467 | A1* | 9/2018 | Matsumoto ......... H01L 21/3205 |

FOREIGN PATENT DOCUMENTS

| | | | | |
|---|---|---|---|---|
| JP | 2017073438 A | | 4/2017 | |
| WO | WO-2017056297 A1 * | | 4/2017 | ......... H01L 21/3205 |

\* cited by examiner

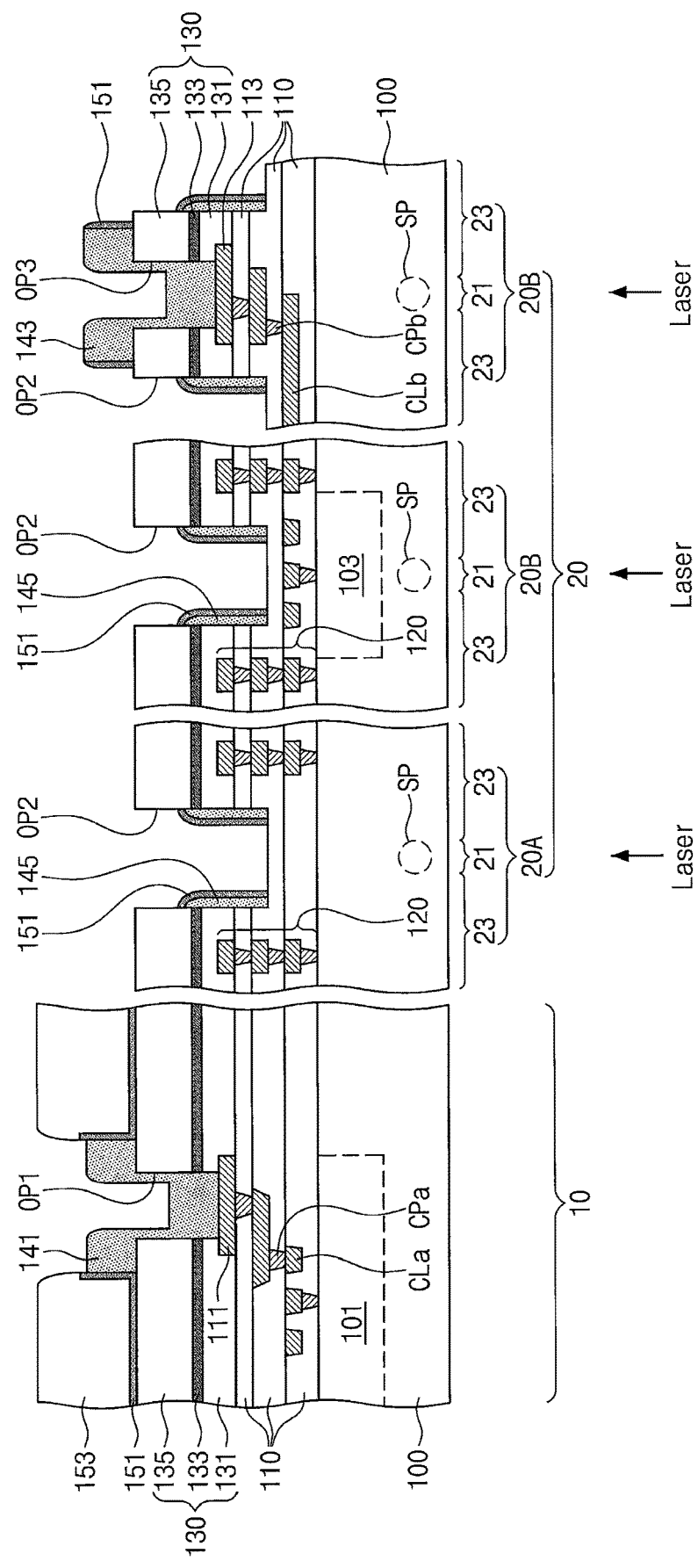

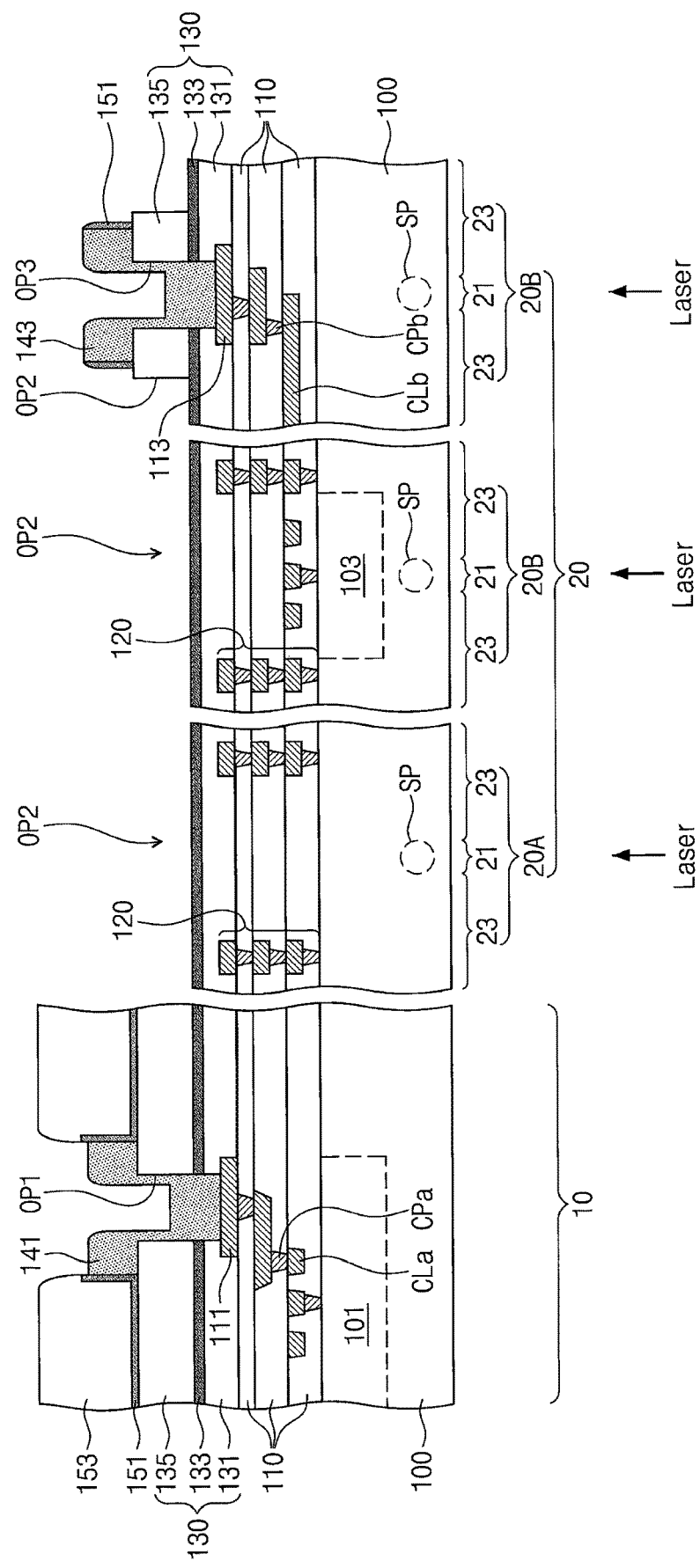

SEMICONDUCTOR DEVICE

CROSS-REFERENCE TO RELATED APPLICATIONS

This U.S. nonprovisional patent application claims priority under 35 U.S.C § 119 of Korean Patent Application No. 10-2017-0094903 filed on Jul. 26, 2017, in the Korean Intellectual Property Office, the entire contents of which are hereby incorporated by reference.

BACKGROUND

The present disclosure relates to semiconductor devices, and more particularly, to semiconductor devices including a redistribution pad.

A semiconductor package may include a semiconductor device capable of storing and processing large amounts of data in a short time. Such a semiconductor device may include a circuit for storing and/or processing data and chip pads for receiving data from the outside and providing the data to the circuit or outputting data from the circuit to the outside.

Some semiconductor devices include redistribution layers connected to the chip pads so as to change the locations of pads disposed at specified positions of the semiconductor device.

When fabricating the semiconductor devices, after completing a test process, a sawing or dicing process may be performed along a cutting region to individually separate chip regions (i.e., semiconductor chips) from the semiconductor substrate on which semiconductor integrated circuits are formed. A packaging process may be performed on the individually separated semiconductor chips. The cutting region may include multiple layers of varying strengths. These differing strength characteristics may result in an incomplete cut of the semiconductor wafer with the devices/circuits formed thereon and/or peeling between the layers.

SUMMARY

Some embodiments of the present inventive concepts provide a semiconductor device including a redistribution pad.

The present inventive concepts are not limited to that mentioned above, embodiments of the inventive concepts, which have not been mentioned above, will be clearly understood to those skilled in the art from the following description.

According to example embodiments of the present inventive concepts, a semiconductor device may comprise a semiconductor substrate including a chip region and an edge region; a lower dielectric layer on the semiconductor substrate; a chip pad on the lower dielectric layer of the chip region; an upper dielectric layer on the lower dielectric layer, the upper dielectric layer comprising a first opening exposing the chip pad on the chip region and a second opening exposing the lower dielectric layer on the edge region; and a redistribution pad connected to the chip pad, the redistribution pad comprising a via portion in the first opening and a pad portion extending from the via portion onto the upper dielectric layer.

According to other example embodiments of the present inventive concepts, a semiconductor device may comprise a semiconductor substrate including a chip region and an edge region; a lower dielectric layer on the semiconductor substrate; a chip pad on the lower dielectric layer of the chip region; an upper dielectric layer on the lower dielectric layer and on the chip pad; and a redistribution pad penetrating the upper dielectric layer and connected to the chip pad, the redistribution pad comprising a via portion in the upper dielectric layer and coupled to the chip pad and comprising a pad portion extending from the via portion onto the upper dielectric layer. The upper dielectric layer may comprise a recessed portion on the edge region.

Details of other example embodiments are included in the description and drawings.

BRIEF DESCRIPTION OF THE DRAWINGS

FIGS. 5A to 5I illustrate cross-sectional views showing operations for fabricating a semiconductor device according to example embodiments of the present inventive concepts.

FIGS. 6A to 6C and 7A to 7D illustrate cross-sectional views showing operations for fabricating a semiconductor device according to example embodiments of the present inventive concepts.

DETAILED DESCRIPTION OF EMBODIMENTS

It will be hereinafter discussed a semiconductor device and a method of fabricating the same according to example embodiments of the present inventive concepts in conjunction with the accompanying drawings.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on").

Some embodiments of the inventive concepts, stem from a realization multiple dielectric layers may be used in a cutting region of a wafer containing multiple semiconductor chips, circuits, and/or devices, which may facilitate a more complete and precise cut when separating the various chips, circuits, and/or devices and may reduce the likelihood of layers peeling apart from one another.

Figure 1:
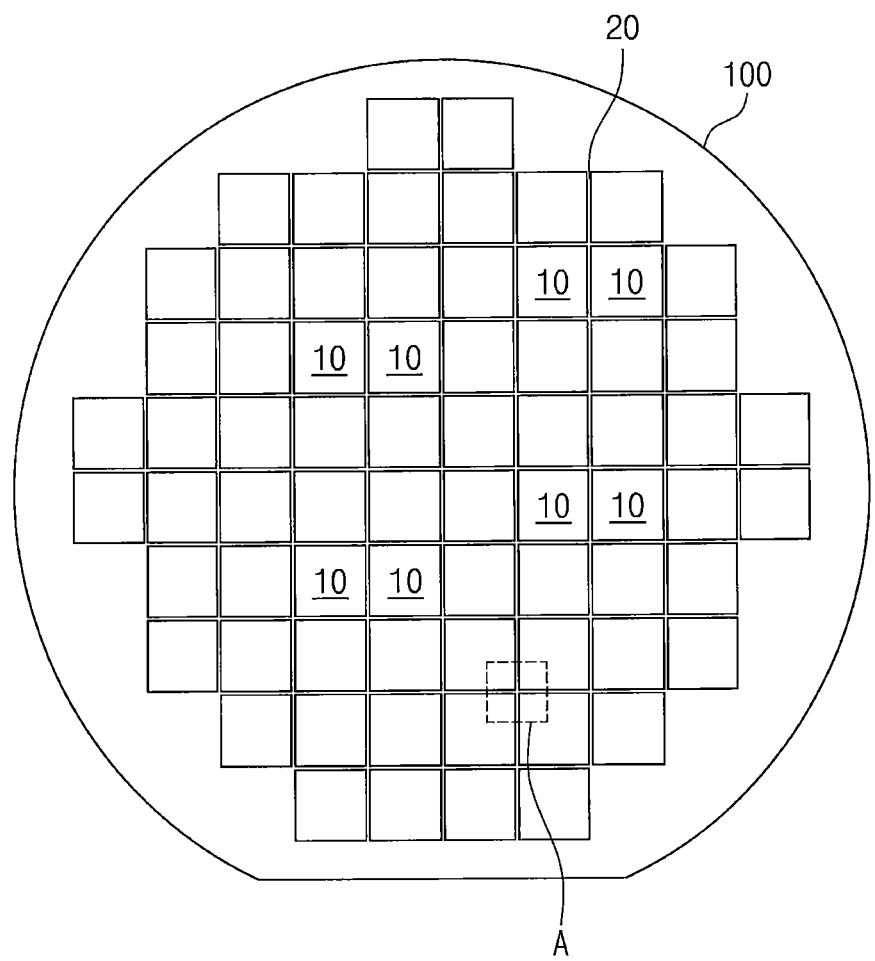
FIG. 1 illustrates a plan view showing a substrate with integrated semiconductor devices according to example embodiments of the present inventive concepts.
Figure 2:
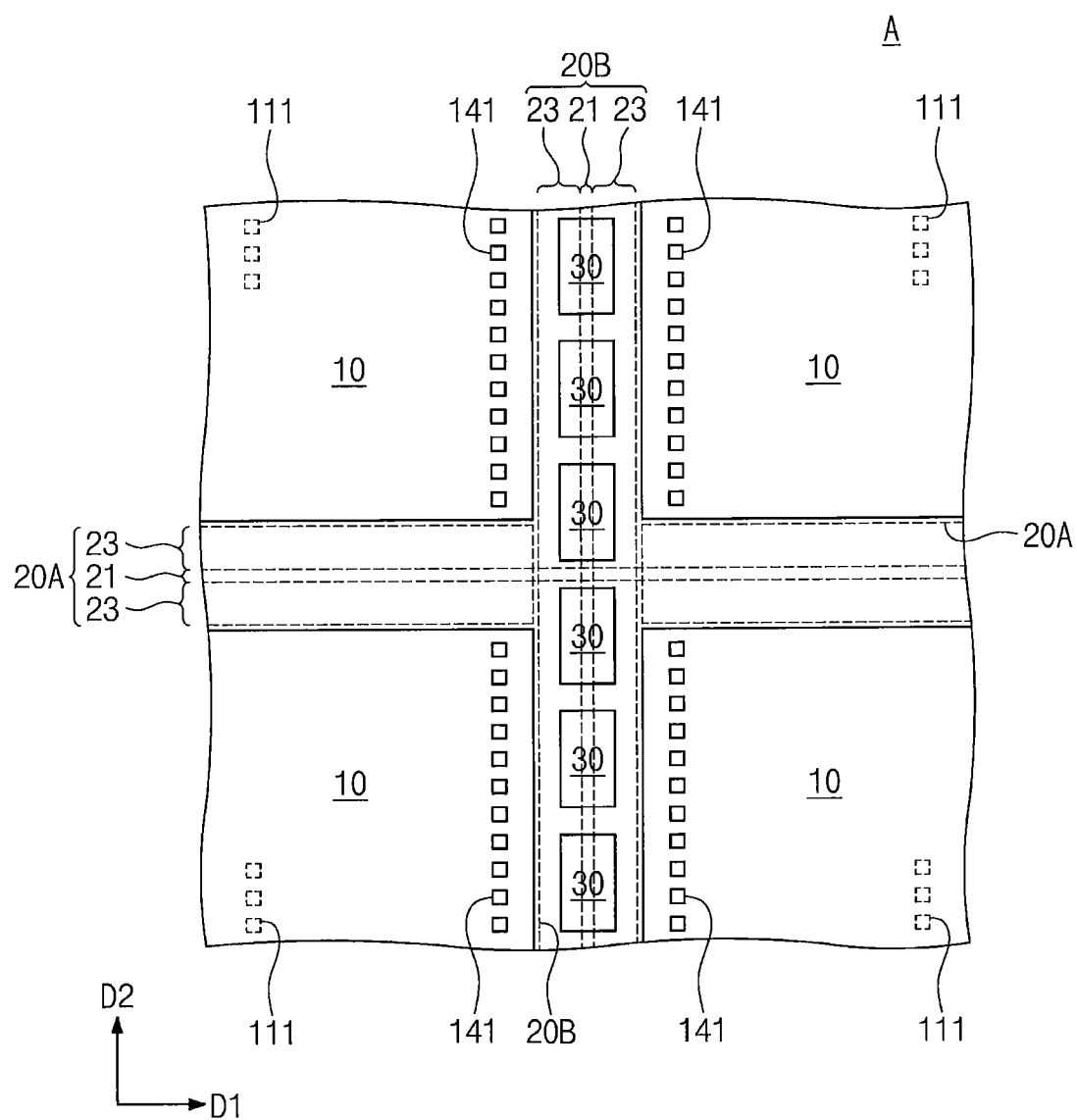
FIG. 2 illustrates an enlarged view showing section A of FIG. 1.
Figure 3:
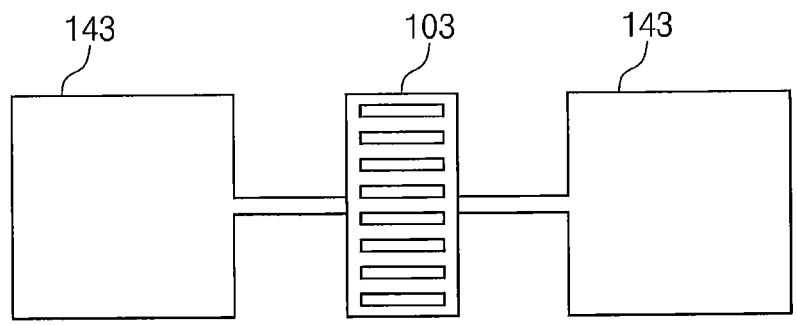
FIG. 3 illustrates a simplified plan view showing a test element group of FIG. 2.

FIG. 1 is a plan view illustrating a substrate with integrated semiconductor devices according to example embodiments of the present inventive concept. FIG. 2 illustrates an enlarged view showing section A of FIG. 1. FIG. 3 illustrates a simplified plan view showing a group of test devices of FIG. 2.

Referring to FIGS. 1 and 2, a semiconductor substrate 100 may include chip regions 10 where corresponding semiconductor integrated circuits are formed and a scribe line region 20 between the chip regions 10. The chip regions 10 may be two-dimensionally arranged along first and second directions D1 and D2 crossing each other. The scribe line region 20 may surround each of the chip regions 10.

The semiconductor substrate 100 may include one of a semiconductor material (e.g., silicon wafer), an insulating material (e.g., glass), and a semiconductor or conductor covered with an insulating material. For example, the semiconductor substrate 100 may be a silicon wafer having a first conductivity type.

Semiconductor memory devices may be provided on the chip regions 10 of the semiconductor substrate 100. The semiconductor memory devices may include DRAM (Dynamic Random Access Memory) devices, SRAM (Static Random Access Memory) devices, NAND Flash Memory devices, and/or RRAM (Resistive Random Access Memory) devices. The semiconductor memory devices may, in some embodiments, include MEMS (Micro Electro Mechanical System) devices, optoelectronic devices, one or more CPU processors, and/or one or more DSP processors. Further, the semiconductor memory devices may include standard cells, such as a logical sum gate and/or a logical product gate.

Chip pads 111 and redistribution chip pads 141 may also be provided on the semiconductor substrate 100 of the chip regions 10. The chip pads 111 and the redistribution chip pads 141 may communicate data or signals with the semiconductor integrated circuits. The chip pads 111 may be disposed on an edge or center of each of the chip regions 10, and the redistribution chip pads 141 may be disposed at a location different from that of the chip pads 111.

Test element groups (TEG) 30 may be provided on the scribe line region 20 or a portion of the chip region 10. The test element groups (TEG) 30 may evaluate electrical characteristics of the semiconductor integrated circuits formed on the chip regions 10. In some embodiments, the scribe line region 20 may include a first scribe line region 20A where no test element groups 30 are provided and a second scribe line region 20B where the test element groups 30 are provided. In addition, the scribe line region 20 may include a cutting region 21 and edge regions 23. The cutting region 21 may be disposed in a central portion of the scribe line region 20 and may be sawed or cut by a sawing or cutting machine.

Referring to FIG. 3, each of the test element groups 30 may include a plurality of test structures 103 and a plurality of redistribution test pads 143. The redistribution test pads 143 may be connected through conductive lines to the test structures 103. The test structures 103 may include test elements having substantially the same structure as that of the semiconductor integrated circuits formed on the chip regions 10. The test structures 103 may include, for example, an NMOSFET, a PMOSFET, and/or a resistor.

Figure 4:
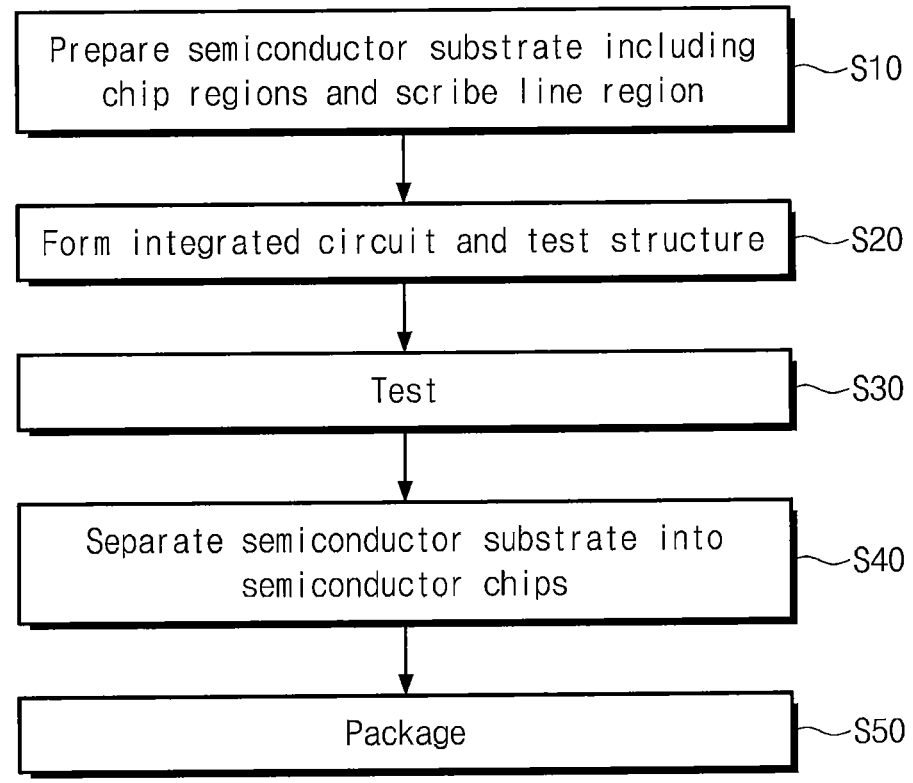
FIG. 4 illustrates a flow chart showing operations for fabricating a semiconductor device according to example embodiments of the present inventive concepts.

FIG. 4 illustrates a flow chart showing operations for fabricating a semiconductor device according to example embodiments of the present inventive concepts.

Referring to FIG. 4, a semiconductor substrate may be prepared (S10). The semiconductor substrate may include a plurality of chip regions and a scribe line region. Semiconductor integrated circuits and test element groups may be formed on the semiconductor substrate by performing semiconductor fabricating processes (S20). The semiconductor integrated circuits and test element groups may be protected by an insulating material. Each of the test element groups may include test structures and redistribution test pads. After the semiconductor integrated circuits and the test element groups are formed, a test process may be performed on the test element groups (S30). When the test process is performed, an electrical signal may be provided through the redistribution test pads to the test structure, and the test element groups may be used to evaluate electrical characteristics of the semiconductor integrated circuits.

After the test process is complete, a sawing or dicing process may be performed along a cutting region of the scribe line region. The sawing process may individually separate the chip regions (i.e., semiconductor chips) from the semiconductor substrate on which the semiconductor integrated circuits are formed (S40). A packaging process may be performed on the individually separated semiconductor chips (S50).

FIGS. 5A to 5I illustrate cross-sectional views showing operations for fabricating a semiconductor device according to example embodiments of the present inventive concepts.

Figure 5A:
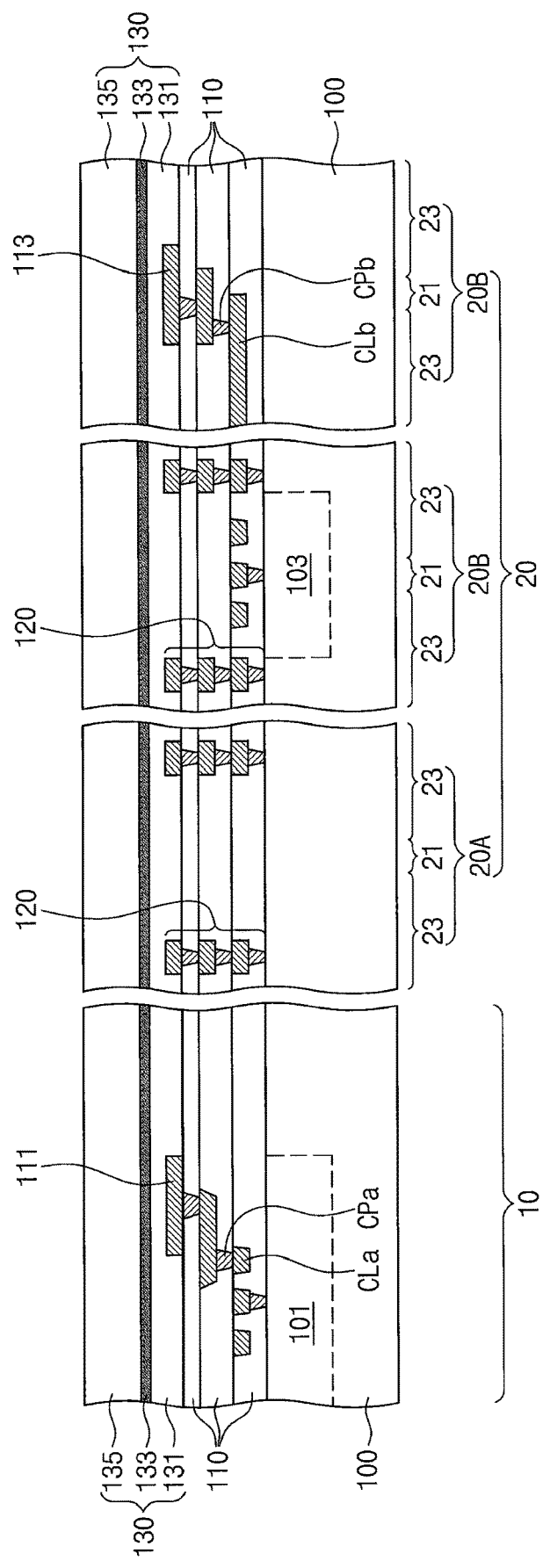

Referring to FIG. 5A, as discussed with reference to FIGS. 1 and 2, a semiconductor substrate 100 may include one or more chip regions 10 and a scribe line region 20, and the scribe line region 20 may include a first scribe line region 20A and a second scribe line region 20B.

A semiconductor integrated circuit 101 may be formed on the semiconductor substrate 100 of the chip region 10. The semiconductor integrated circuit 101 may include a memory cell array, which includes switching elements and/or data storage elements, and logic elements, which include a MOSFET, a capacitor, and/or a resistor.

A lower dielectric layer 110 may be formed on the semiconductor substrate 100 of the chip region 10, and may include a plurality of stacked insulating layers. The lower dielectric layer 110 of the chip region 10 may extend onto the first and second scribe line regions 20A and 20B, and may cover an entire surface of the semiconductor substrate 100.

In some embodiments, the lower dielectric layer 110 may be formed of a low-k dielectric material whose dielectric constant is less than that of a silicon oxide layer. The lower dielectric layer 110 may have a dielectric constant ranging from about 1.0 to about 3.0, and may include one or more of an inorganic material, an organic material, and an organic-inorganic hybrid material. The lower dielectric layer 110 may be porous or non-porous. The lower dielectric layer 110 may be formed of, for example, an impurity-doped silicon oxide-based material or a low-k organic polymer.

The impurity-doped silicon oxide-based material may include, for example, fluorine-doped oxide (or FSG), carbon-doped oxide, silicon oxide, HSQ (hydrogen silsesquioxane, SiO:H), MSQ (methyl silsesquioxane, SiO:CH$_3$), and/or a-SiOC (SiOC:H). The low-k organic polymer may include, for example, polyallylether-based resin, cyclic fluoride resin, siloxane copolymer, polyallylether fluoride-based resin, polypentafluorostyrene, polytetrafluorostyrene-based resin, polyimide fluoride resin, polynaphthalene fluoride, and/or polycide resin.

The lower dielectric layer 110 may further include one or more vertically stacked barrier layers (not shown) between the insulating layers, and the barrier layer(s) may include one or more insulating materials, such as SiN, SiON, SiC, SiCN, SiOCH, SiOC, and/or SiOF.

An inner line structure CLa and CPa may be formed in the lower dielectric layer 110 of the chip region 10 to come into electrical connection with the semiconductor integrated circuit 101. The inner line structure CLa and CPa may include conductive lines CLa and conductive plugs CPa. The conductive plugs CPa may penetrate the lower dielectric layer 110 and connect the conductive lines CLa at different levels. For example, the conductive lines CLa and the conductive plugs CPa may include metal nitride, such as TiN, WN, TaN, and/or TaSiN, and/or metal, such as W, Al, Ti, Ta, Co, and/or Cu.

A chip pad 111 may be formed on a topmost one of the plurality of stacked insulating layers constituting the lower dielectric layer 110, and may be electrically connected through the inner line structure CLa and CPa to the semiconductor integrated circuit 101. The chip pad 111 may be a data pad that communicates data signals, a command/address pad that communicates command/address signals, a ground or power pad to which a ground or power voltage is applied, and/or a pad for testing the semiconductor integrated circuit 101. For example, the chip pad 111 may include metal nitride, such as TiN, WN, TaN, and/or TaSiN, and/or metal, such as W, Al, Ti, Ta, Co, and/or Cu.

A dam structure 120 may be formed on the semiconductor substrate 100 of the first and second scribe line regions 20A and 20B. As viewed in plan, the dam structure 120 may extend around each of the chip regions 10 to have a ring shape or a closed curve shape. The dam structure 120 may be formed simultaneously with the inner line structure CLa and CPa of the chip region 10, and may include conductive plugs penetrating the lower dielectric layer 110 and conductive patterns on the conductive plugs.

One or more test structures 103 may be formed on the semiconductor substrate 100 of the second scribe line region 20B, and conductive lines CLb and conductive plugs CPb may also be formed on the semiconductor substrate 100 of the second scribe line region 20B to come into connection with the test structure 103. The test structure 103 may include, as discussed above, a test element having substantially the same structure as that of the semiconductor integrated circuit 101 formed on the chip region 10. For example, a MOSFET and/or a resistor may be formed on the semiconductor substrate 100 of the second scribe line region 20B. The test structure 103 may be formed simultaneously with the semiconductor integrated circuit 101 of the chip region 10, and the conductive lines CLb and the conductive plugs CPb of the second scribe line region 20B may be formed simultaneously with the inner line structure CLa and CPa.

On the second scribe line region 20B, one or more test pads 113 may be formed on the lower dielectric layer 110 to come into connection with the one or more test structures 103.

An upper dielectric layer 130 may be formed on the entire surface of the semiconductor substrate 100, and may cover the chip pad 111 and the test pad 113 on the lower dielectric layer 110. In some embodiments, the upper dielectric layer 130 may include an insulating material whose strength is greater than that of the lower dielectric layer 110. In addition, the upper dielectric layer 130 may include an insulating material whose dielectric constant is greater than that of the lower dielectric layer 110.

The upper dielectric layer 130 may include a silicon oxide layer, a silicon nitride layer, and/or a silicon oxynitride layer.

The upper dielectric layer 130 may include, for example, high density plasma (HDP) oxide, TEOS (tetraethylorthosilicate), PE-TEOS (plasma enhanced tetraethylorthosilicate), $O_3$-TEOS (O3-tetratthylorthosilicate), USG (undoped silicate glass), PSG (phosphosilicate glass), BSG (borosilicate glass), BPSG (borophosphosilicate glass), FSG (fluorosilicate glass), SOG (spin on glass), TOSZ (tonen silazene), or combinations thereof.

In some embodiments, the upper dielectric layer 130 may include a plurality of insulating layers. For example, the upper dielectric layer 130 may include a first upper dielectric layer 131, a second upper dielectric layer 133, and a third upper dielectric layer 135 sequentially stacked on the lower dielectric layer 110. The second upper dielectric layer 133 may include an insulating material exhibiting an etch selectivity with respect to the first and third upper dielectric layers 131 and 135, and may be thinner than the first and third upper dielectric layers 131 and 135.

The first and third upper dielectric layers 131 and 135 may include different insulating materials from each other, and the third upper dielectric layer 135 may be thicker than the first upper dielectric layer 131. For example, the first upper dielectric layer 131 may be a high density plasma (HDP) oxide layer, and the third upper dielectric layer 135 may be a tetraethylorthosilicate (TEOS) layer.

Figure 5B:
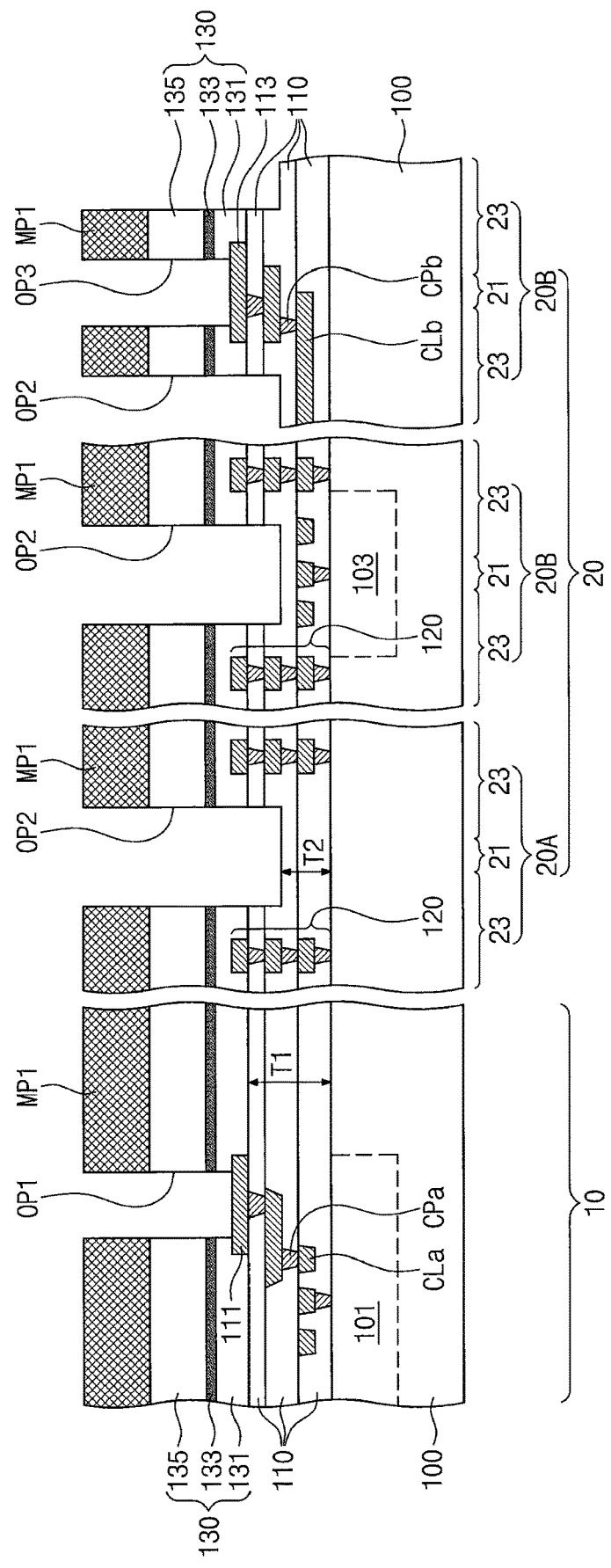

Referring to FIG. 5B, a first opening OP1 may be formed on the upper dielectric layer 130 of the chip region 10, and second and third openings OP2 and OP3 may be formed on the upper dielectric layer 130 of the first and second scribe line regions 20A and 20B.

For example, the formation of the first, second, and third openings OP1, OP2, and OP3 may include forming on the upper dielectric layer 130 a first mask pattern MP1 having openings and using the first mask pattern MP1 as an etch mask to partially anisotropically etch the upper and lower dielectric layers 130 and 110.

In some embodiments, the first opening OP1 may expose the chip pad 111 on the chip region 10, and the second opening OP2 may partially expose the lower dielectric layer 110 on the first and second scribe line regions 20A and 20B. The third opening OP3 may expose the test pad 113 on the second scribe line region 20B.

The first to third openings OP1 to OP3 may be formed at the same time, and the second opening OP2 may have an etching depth greater than those of the first and third openings OP1 and OP3. For example, the second opening OP2 may have a bottom surface lower than those of the first and third openings OP1 and OP3 relative to the semiconductor substrate 100. The second opening OP2 may have a width different from those of the first and third openings OP1 and OP3 in a horizontal direction with respect to the cross-sectional view of FIG. 5B.

In some embodiments, the formation of the second opening OP2 may cause the lower and upper dielectric layers 110 and 130 to have their thicknesses locally reduced on the first and second scribe line regions 20A and 20B. For example, on the first and second scribe line regions 20A and 20B, the lower dielectric layer 110 may have a first segment having a first thickness T1 and a second segment having a second thickness T2 less than the first thickness T1. The first thickness T1 of the first segment may be substantially the same as a thickness of the lower dielectric layer 110 on the chip region 10. The formation of the first to third openings OP1 to OP3 may be followed by removal of the first mask pattern MP1.

Figure 5C:
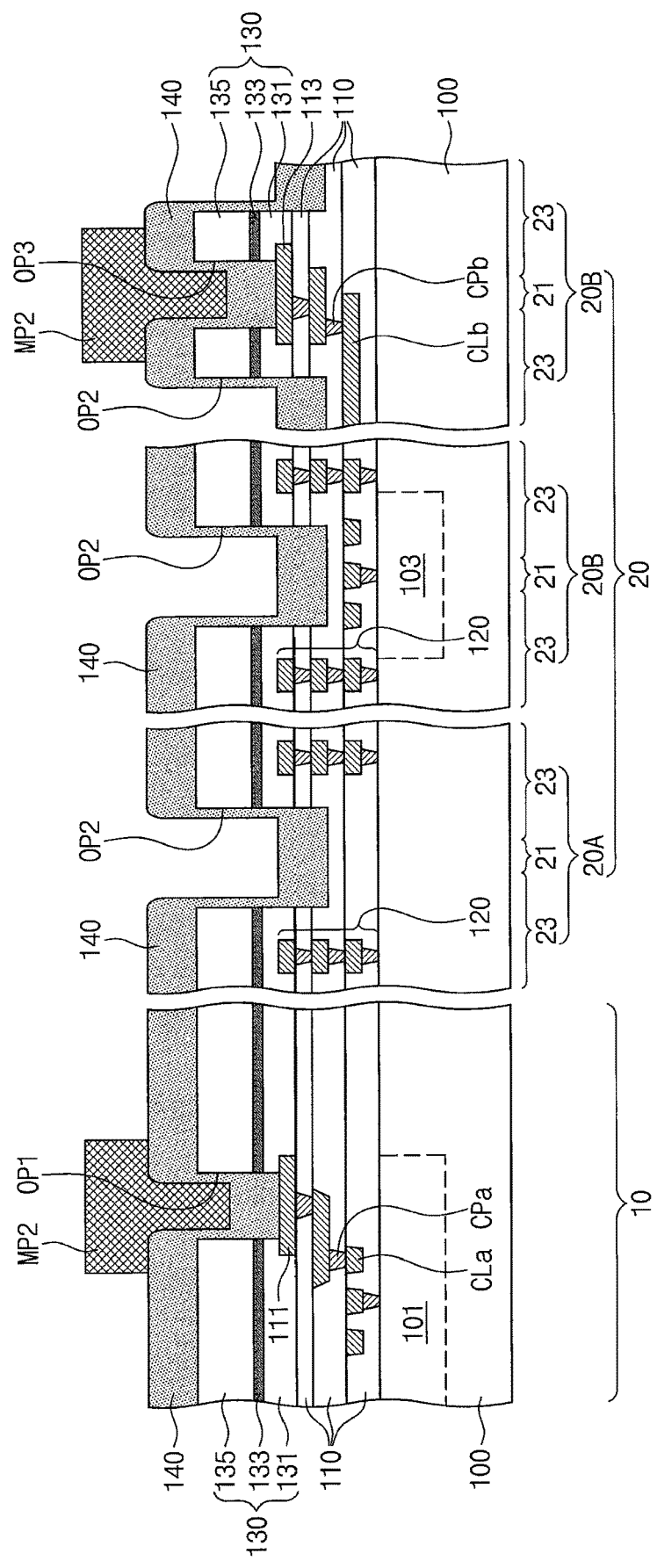

Referring to FIG. 5C, a redistribution layer 140 may be formed on the upper dielectric layer 130 having the first to third openings OP1 to OP3. The formation of the redistribution layer 140 may include forming a metal seed layer to conformally cover the upper dielectric layer 130 having the first to third openings OP1 to OP3 and forming a metal layer on the metal seed layer. The metal seed layer and the metal layer may be formed by a thin-layer deposition method, such as electroplating, electroless plating, and/or sputtering. The redistribution layer 140 may include copper (Cu), aluminum (Al), nickel (Ni), silver (Ag), gold (Au), platinum (Pt), tin (Sn), lead (Pb), titanium (Ti), chromium (Cr), palladium (Pd), indium (In), zinc (Zn), carbon (C), an alloy thereof, or combinations thereof.

In some embodiments, the redistribution layer 140 may include a metallic material different from that of the inner line structure CPa and CLa. For example, the redistribution layer 140 may include aluminum (Al), and the inner line structure CPa and CLa may include tungsten (W) and/or copper (Cu).

The redistribution layer 140 may partially fill the first to third openings OP1 to OP3, and may be in contact with the chip pad 111 and the test pad 113 respectively exposed to the first and third openings OP1 and OP3.

A second mask pattern MP2 may be formed on the redistribution layer 140 after its formation. The second mask pattern MP2 may cover an upper portion of the chip pad 111 and an upper portion of the test pad 113.

The second mask pattern MP2 may be used as an etch mask to etch the redistribution layer 140. For example, an etching process may be performed on the redistribution layer 140 exposed by the second mask pattern MP2.

Figure 5D:
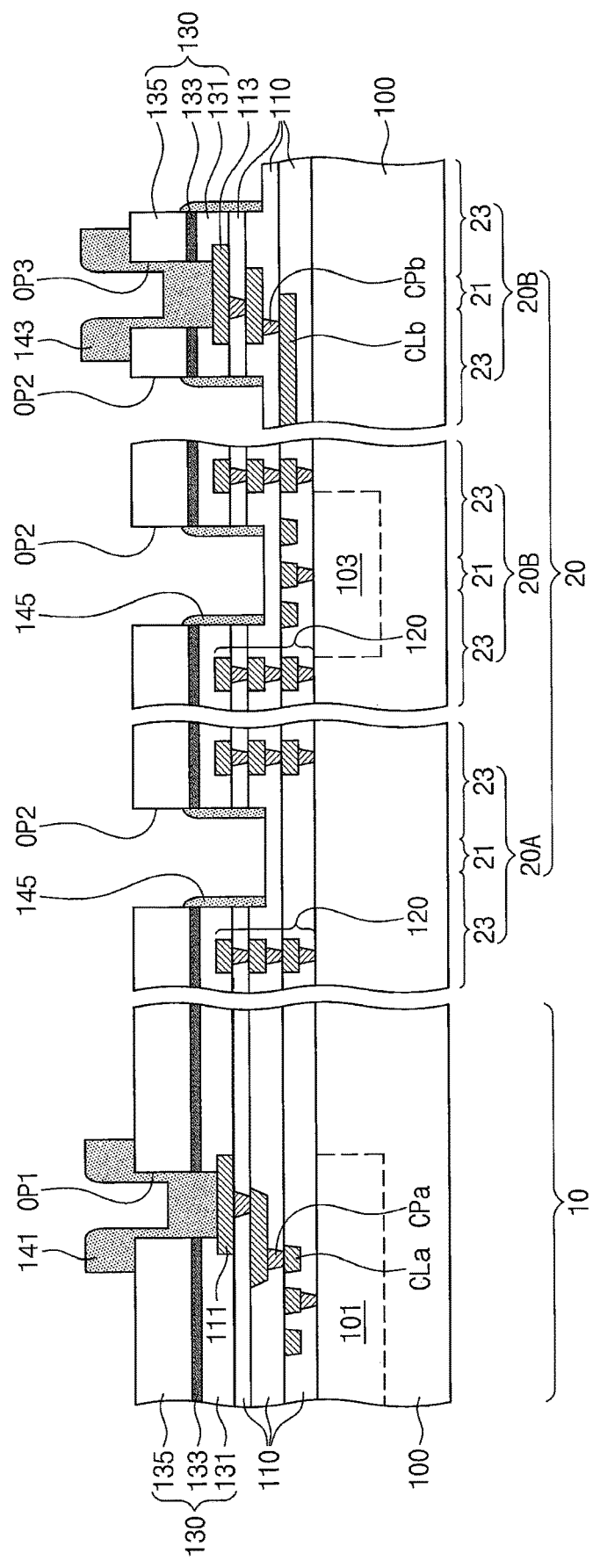

The etching process may form, as illustrated in FIG. 5D, a redistribution chip pad 141 in the first opening OP1 of the chip region 10, and may form a redistribution test pad 143 in the third opening OP3 of the second scribe line region 20B.

When the etching process is performed to form the redistribution chip pad 141 and the redistribution test pad 143, the redistribution layer 140 may be removed from the bottom surface of the second opening OP2, and a redistribution spacer 145 may remain on an inner sidewall of the second opening OP2. The redistribution spacer 145 may include the same metallic material as that of the redistribution chip pad 141 and that of the redistribution test pad 143.

Figure 5E:
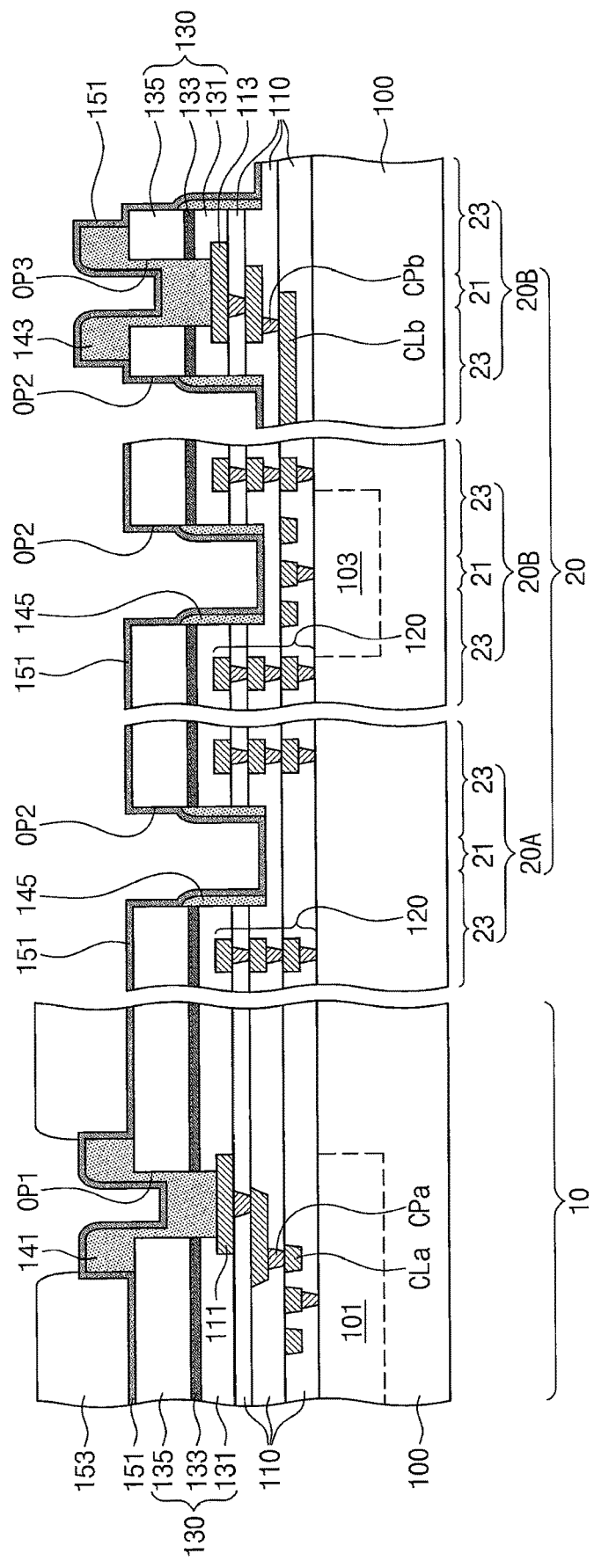

Referring to FIG. 5E, a passivation layer 153 partially exposing the redistribution chip pad 141 may be formed on the upper dielectric layer 130 of the chip region 10. Before the passivation layer 153 is formed, a protection layer 151 of generally uniform thickness may be formed on the entire surface of the semiconductor substrate 100.

The protection layer 151 may include, for example, a silicon nitride layer and/or a silicon oxynitride layer. The passivation layer 153 may include, for example, a polyimide-based material such as photosensitive polyimide (PSPI). A spin coating process may be used to deposit the passivation layer 153 on the protection layer 151, and without forming a photoresist layer, an exposure process may be performed to partially expose the protection layer 151 on the redistribution chip pad 141 and to expose the protection layer 151 on the first and second scribe line regions 20A and 20B.

Figure 5F:
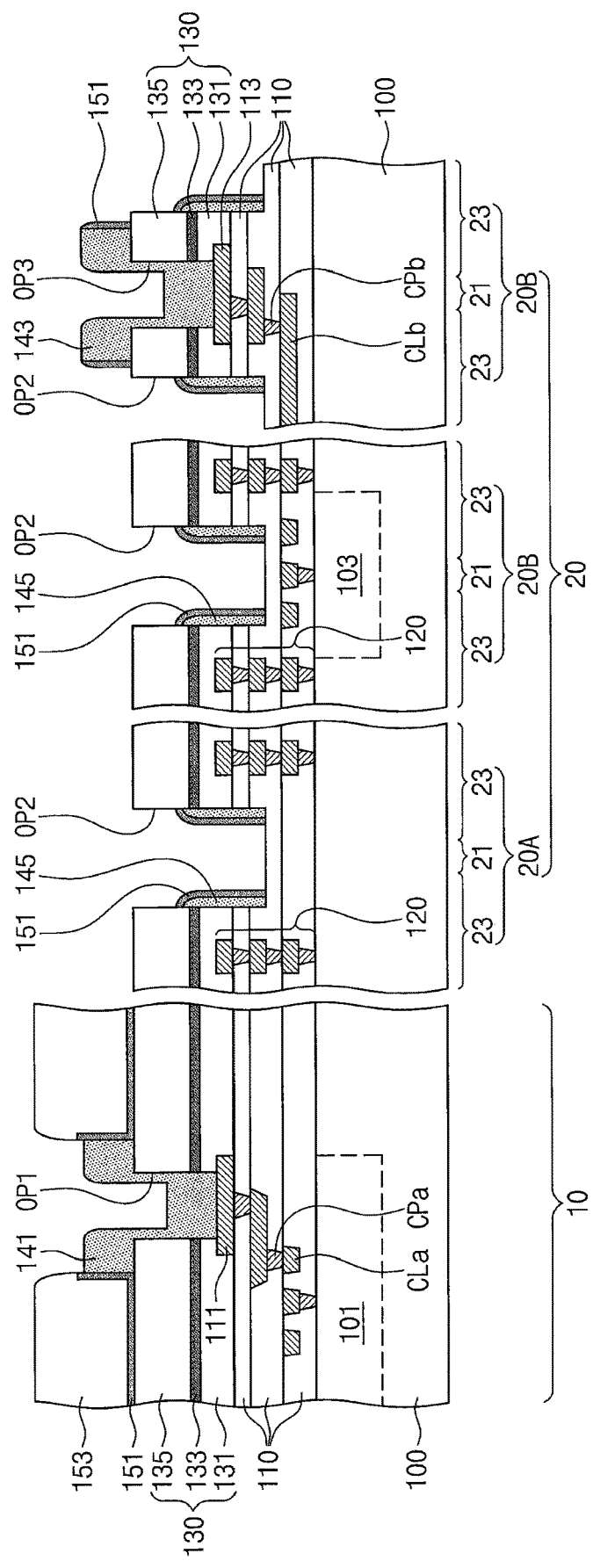

Referring to FIG. 5F, the protection layer 151 exposed by the passivation layer 153 may be etched to reveal the redistribution chip pad 141 and the redistribution test pad 143. In this step, the protection layer 151 may be removed from a top surface of the upper dielectric layer 130 of the first and second scribe line regions 20A and 20B and from the bottom surface of the second opening OP2. The lower dielectric layer 110 may then partially appear on the first and second scribe line regions 20A and 20B.

After exposing the redistribution chip pad 141 and the redistribution test pad 143, a test process may be performed as described above with reference to FIG. 4. After the test process is terminated, as described below with reference to FIGS. 5G and 5H, the semiconductor substrate 100 may experience a cutting process performed along the first and second scribe line regions 20A and 20B.

Referring to FIG. 5G, a laser beam may be applied from a backside of the semiconductor substrate 100. The laser beam may be irradiated onto the cutting region 21 of the first and second scribe line regions 20A and 20B. The semiconductor substrate 100 may, thus, change in physical characteristics at a laser spot region SP onto which the laser is irradiated. For example, the semiconductor substrate 100 may decrease in physical strength at the laser spot region SP.

Figure 5H:
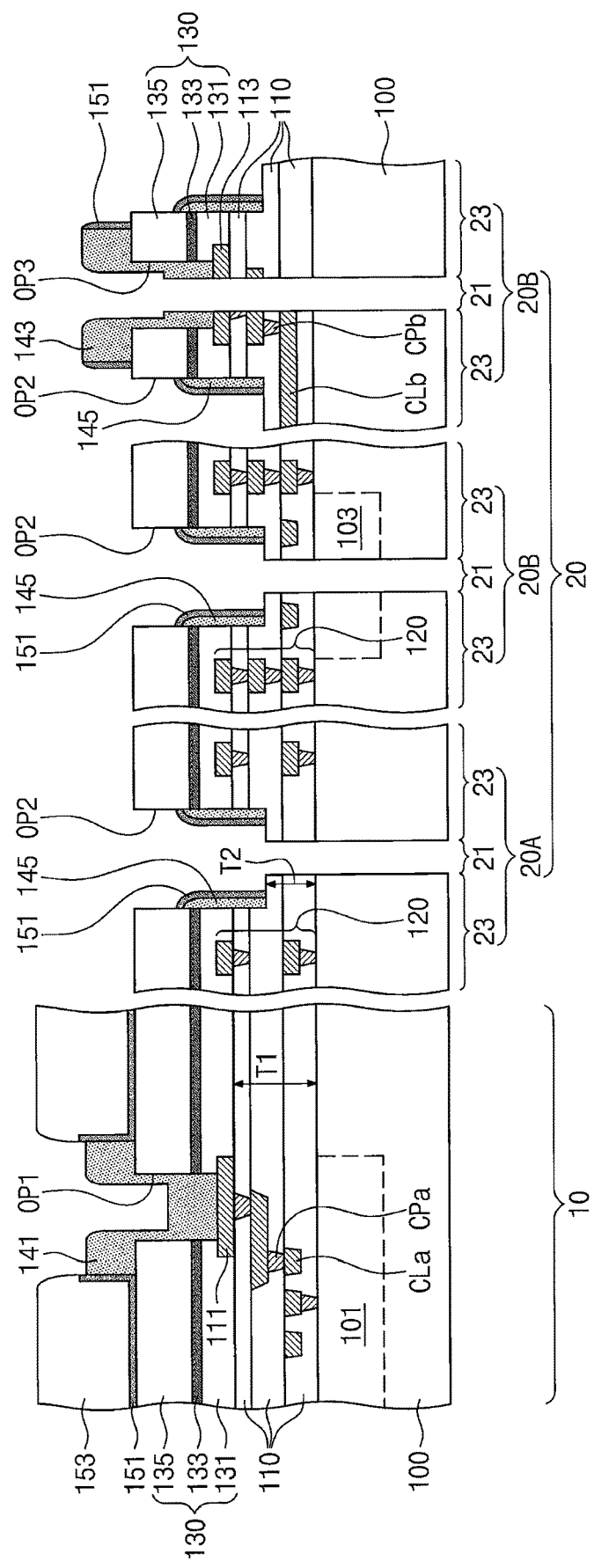

Referring to FIG. 5H, the semiconductor substrate 100 may be placed on a thin tape (not shown), and then a force may be provided to horizontally extend the thin tape, which may cut the semiconductor substrate 100 along the cutting region 21 of the first and second scribe line regions 20A and 20B. Alternatively, a sawing process may be performed along the cutting region 21 of the first and second scribe line regions 20A and 20B to separate the chip regions 10 into individual pieces. The sawing process may use a sawing wheel or a laser.

When the chip regions 10 of the semiconductor substrate 100 are separated into individual pieces, because the cutting region 21 includes no upper dielectric layer 130 whose strength is greater than that of the lower dielectric layer 110, an incomplete cut of the semiconductor substrate 100 caused by a difference in characteristics between the lower and upper dielectric layers 110 and 130 may be avoided and/or thin layers may be suppressed from peeling off the semiconductor substrate 100. For example, the lower and upper dielectric layers 110 and 130 may be less likely to horizontally split along an interface therebetween. In addition, because the lower dielectric layer 110 has a smaller thickness on the cutting region 21 than on edge regions 23, the cutting process may be more easily performed on the semiconductor substrate 100.

The cutting process on the semiconductor substrate 100 may be performed such that a plurality of semiconductor devices (or semiconductor chips) may be separated from the chip regions 10 of the semiconductor substrate 100 on which the semiconductor integrated circuits 101 are formed. Furthermore, the cutting process may cut the test structure 103 and the redistribution test pad 143.

In some embodiments, each of the semiconductor devices (or the semiconductor chips) separated from the semiconductor substrate 100 may include the chip region 10 and the edge region 23 around the chip region 10. The lower dielectric layer 110 may have a step difference on the edge region 23. For example, on the edge region 23, the lower dielectric layer 110 may include the first segment having the first thickness T1 and the second segment having the second thickness T2 less than the first thickness T1. The upper dielectric layer 130 may cover the first segment of the lower dielectric layer 110, and the redistribution spacer 145 may remain on the second segment of the lower dielectric layer 110.

Figure 5I:
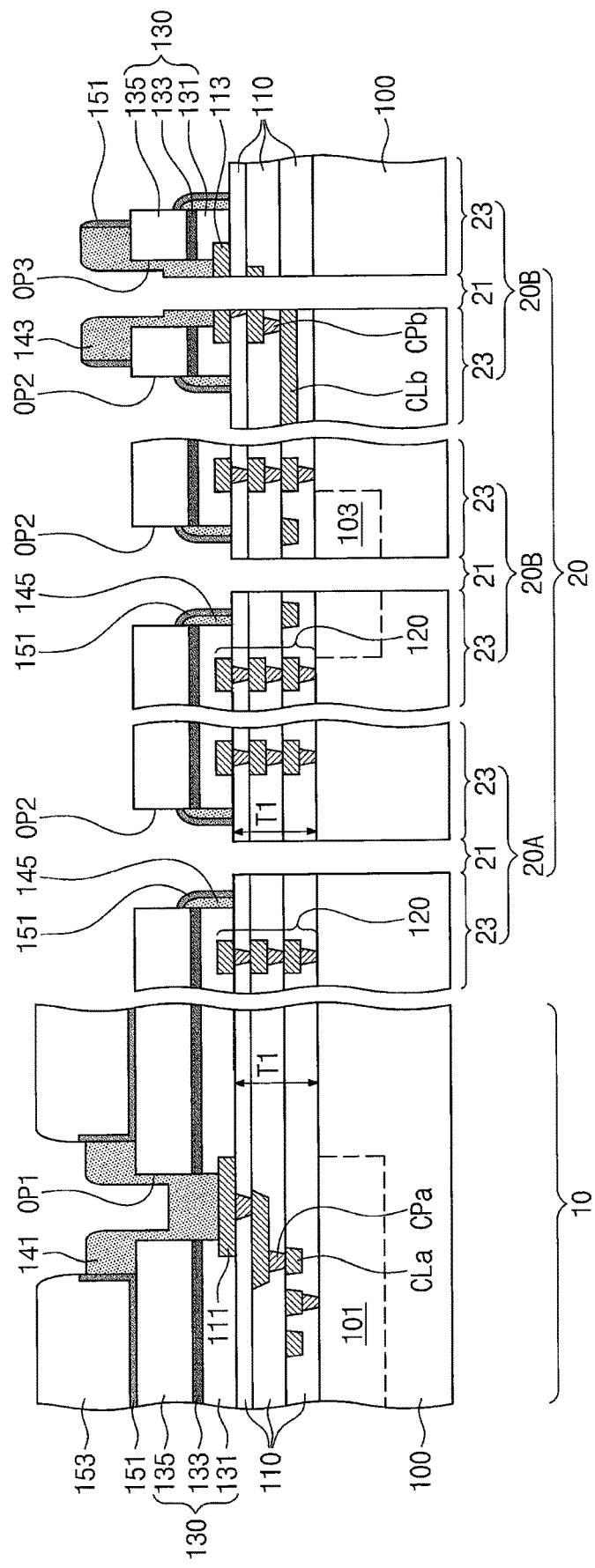

According to other embodiments illustrated in FIG. 5I, the thickness T1 of the lower dielectric layer 110 on the edge region 23 may be substantially the same as the thickness T1 of the lower dielectric layer 110 on the chip region 10. The upper dielectric layer 130 may partially expose the lower dielectric layer 110.

Figure 6A:
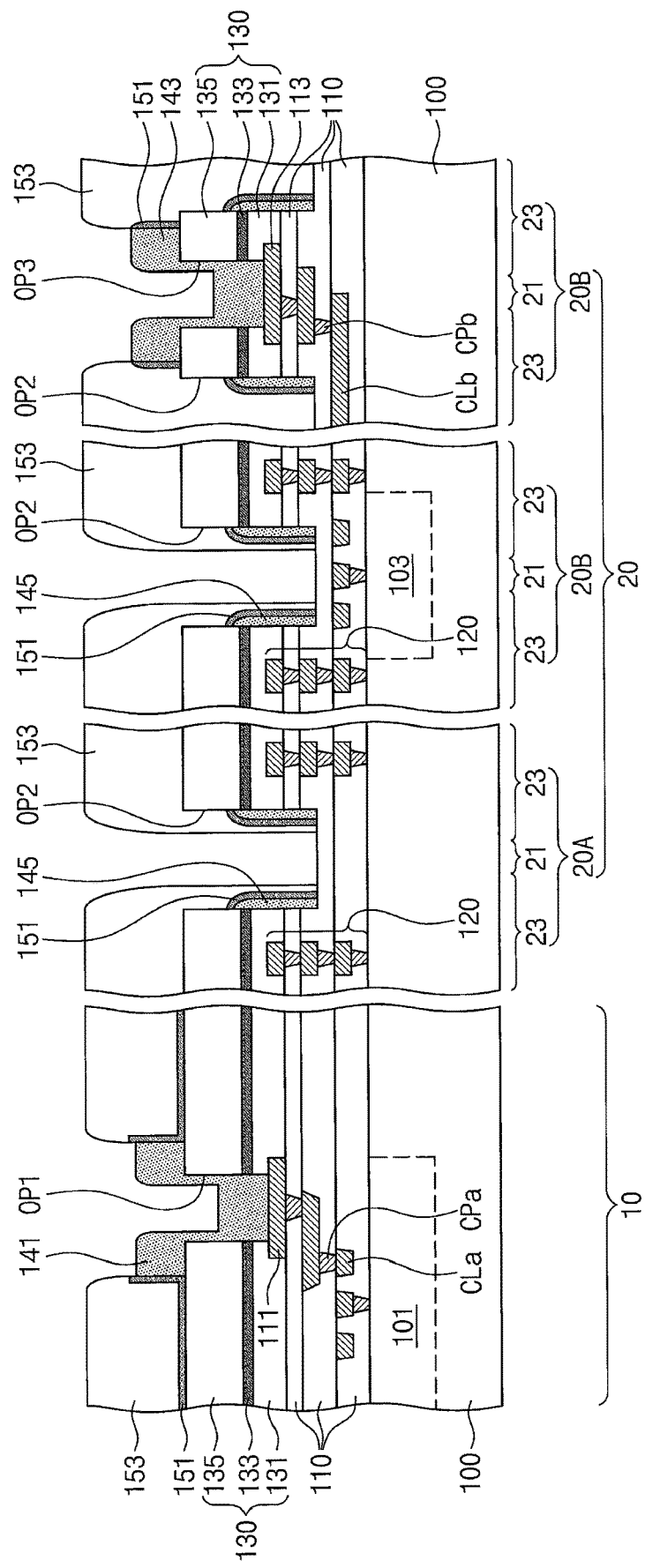
Figure 6B:
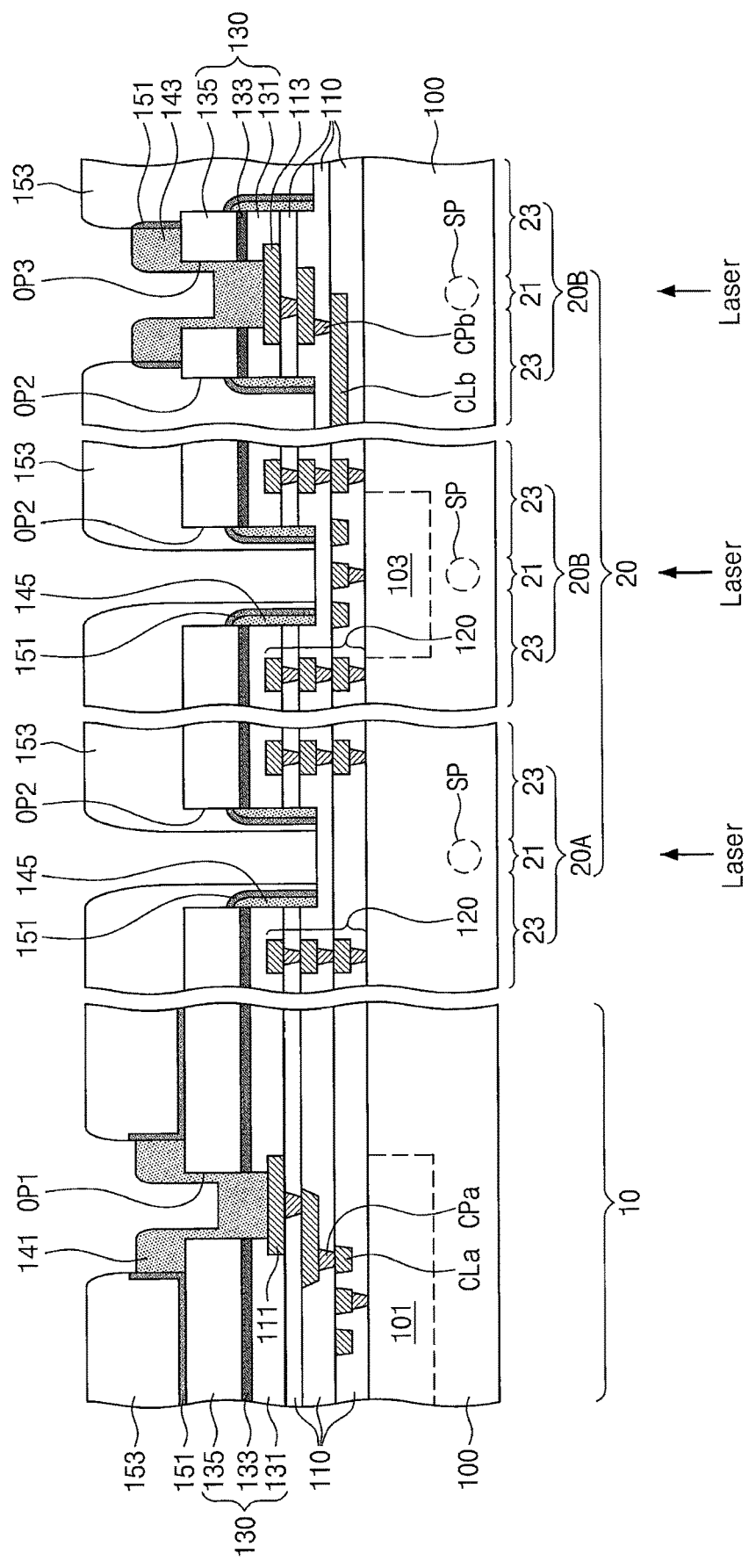
Figure 6C:
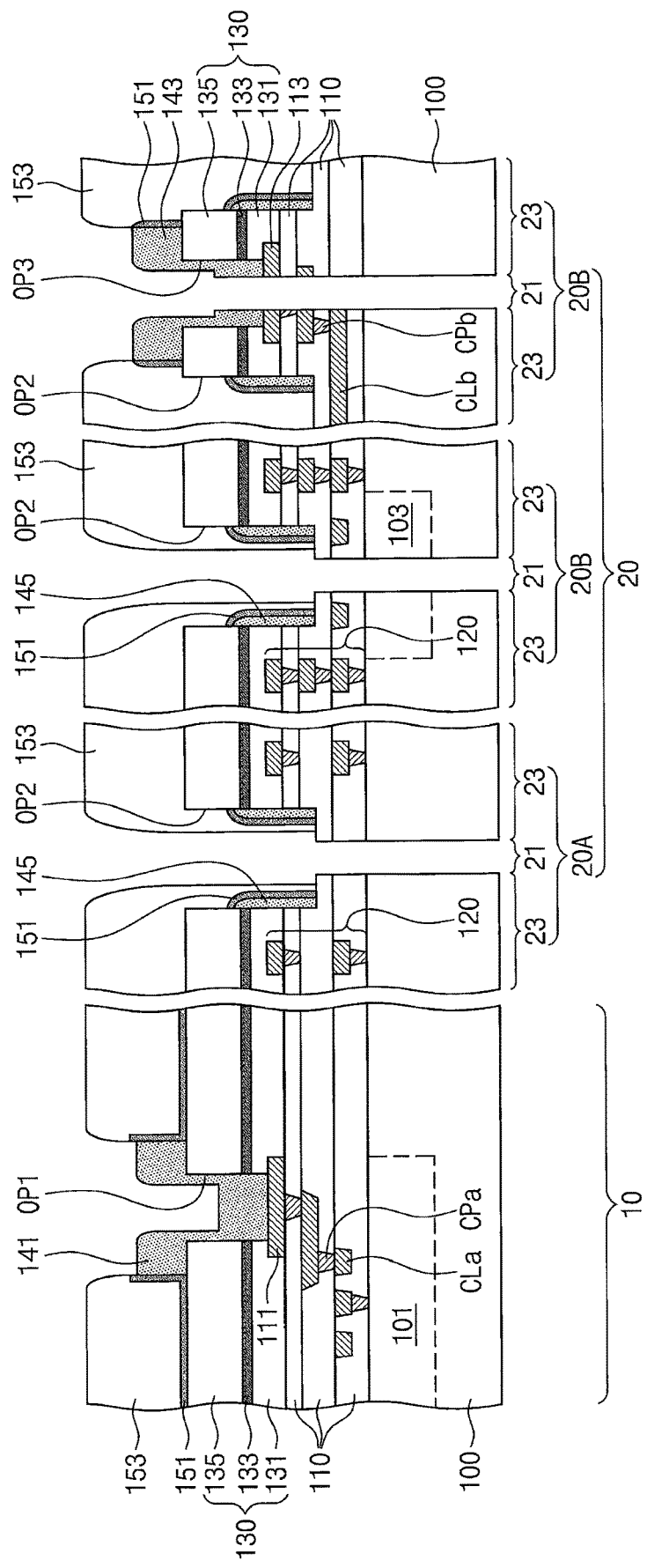

FIGS. 6A to 6C illustrate cross-sectional views showing operations for fabricating a semiconductor device according to example embodiments of the present inventive concepts. The same technical features as those of the embodiments described above with reference to FIGS. 5A to 5I may be omitted in the interest of brevity of description.

As described above with reference to FIG. 5E, after forming the redistribution chip pad 141 and the redistribution test pad 143, the protection layer 151 and the passivation layer 153 may be sequentially formed on the entire surface of the semiconductor substrate 100.

Referring to FIG. 6A, an exposure process may be performed on the passivation layer 153 to form openings on the passivation layer 153. The openings may partially expose the redistribution chip pad 141 and expose the cutting region 21 of the first and second scribe line regions 20A and 20B. The passivation layer 153 may extend from the chip region 10 to the scribe line region 20 to thereby cover the redistribution spacer 145 remaining on the inner sidewall of the second opening OP2. Namely, the passivation layer 153 may cover the inner sidewall of the second opening OP2.

Referring to FIG. 6B, as described above, a laser may be irradiated onto the bottom surface of the semiconductor substrate 100 to form the laser spot region SP at a portion of the semiconductor substrate 100.

Referring to FIG. 6C, the semiconductor substrate 100 may be cut along the first and second scribe line regions 20A and 20B, and may therefore be separated into a plurality of semiconductor chips. Each of the semiconductor chips separated from the semiconductor substrate 100 may include the chip region 10 and the edge region 23 around the chip region 10.

According to the present embodiments, the lower dielectric layer 110 may have a difference in thickness on the edge region 23, and the redistribution spacer 145 may be covered with the passivation layer 153 that extends from the chip region 10 to the edge region 23.

FIGS. 7A to 7D illustrate cross-sectional views showing operations for fabricating a semiconductor device according to example embodiments of the present inventive concepts. The same technical features as those of the embodiments described above with reference to FIGS. 5A to 5I may be omitted in the interest of brevity of description.

Figure 7A:
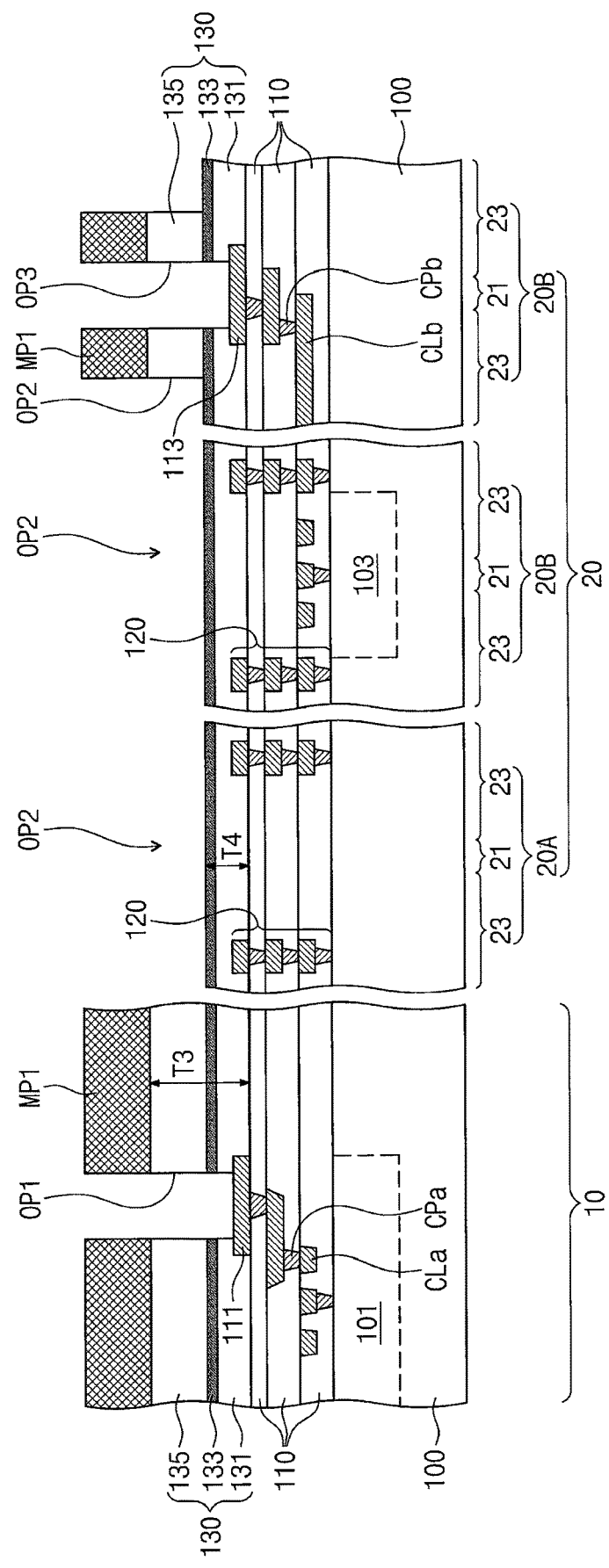

Referring to FIG. 7A, as described above with reference to FIG. 5A, the upper dielectric layer 130 may be provided on the lower dielectric layer 110, and the upper dielectric layer 130 may include the first, second, and third upper dielectric layers 131, 133, and 135. The first mask pattern MP1 having openings may be provided on the upper dielectric layer 130. The first mask pattern MP1 may be used as an etch mask to anisotropically etch the upper dielectric layer 130 to form the first opening OP1 on the upper dielectric layer 130 of the chip region 10, and to form the second and third openings OP2 and OP3 on the upper dielectric layer 130 of the first and second scribe line regions 20A and 20B. The first opening OP1 may expose the chip pad 111 on the chip region 10, and the second opening OP2 may partially expose the upper dielectric layer 130 on the first and second scribe line regions 20A and 20B. The third opening OP3 may expose the test pad 113 on the second scribe line region 20B.

According to the present embodiments, when the first to third openings OP1 to OP3 are formed, the first and third openings OP1 and OP3 may have etching depths different from that of the second opening OP2. For example, when the first and third openings OP1 and OP3 are formed, the second opening OP2 may expose the second upper dielectric layer 133. Accordingly, a thickness T4 of the upper dielectric layer 130 on the first and second scribe line regions 20A and 20B may become smaller than a thickness T3 of the upper dielectric layer 130 on the chip region 10.

Figure 7B:
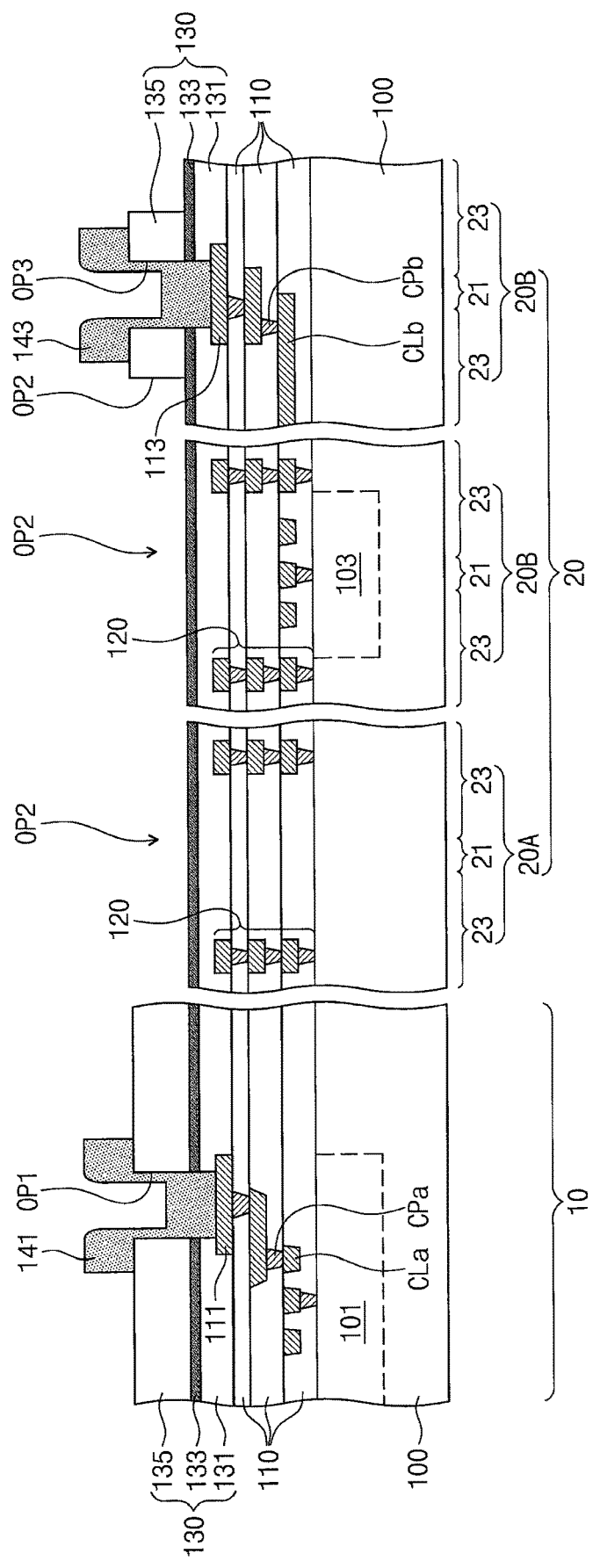

Referring to FIG. 7B, as described above with reference to FIGS. 5C and 5D, the redistribution layer 140 may be formed on the upper dielectric layer 130 including the first to third openings OP1 to OP3, and may then be patterned to form the redistribution chip pad 141 in the first opening OP1 of the chip region 10 and to form the redistribution test pad 143 in the third opening OP3 of the second scribe line region 20B. The redistribution layer 140 may be removed from the second opening OP2 during forming the redistribution chip pad 141 and the redistribution test pad 143.

Referring to FIG. 7C, as described above with reference to FIG. 5F, the passivation layer 153 partially exposing the redistribution chip pad 141 may be formed on the upper dielectric layer 130 of the chip region 10. After the test process is performed using the redistribution test pad 143, as described with reference to FIG. 5G, a laser may be irradiated onto the bottom surface of the semiconductor substrate 100, and, as a result, the semiconductor substrate 100 may decrease in strength at the laser spot region SP.

Figure 7D:
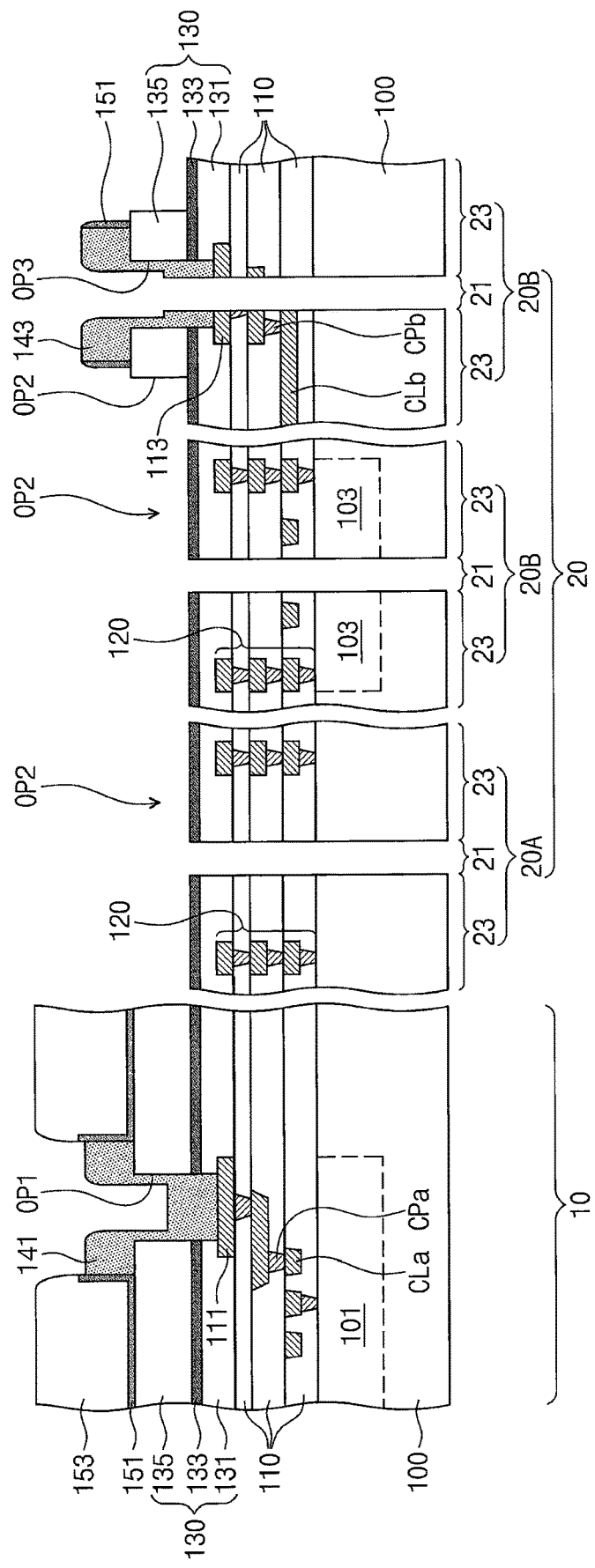

Referring to FIG. 7D, a force may be horizontally applied to the semiconductor substrate 100, thereby cutting the semiconductor substrate 100 along the first and second scribe line regions 20A and 20B. Accordingly, a plurality of semiconductor devices (or semiconductor chips) may be separated from the semiconductor substrate 100 on which the semiconductor integrated circuits 101 are formed. When the cutting process is performed on the semiconductor substrate 100, because a thickness of the upper dielectric layer 130 on the first and second scribe line regions 20A and 20B is less than a thickness of the upper dielectric layer 130 on the chip region 10, the first to third upper dielectric layers 131, 133, and 135 may not horizontally split along interfaces therebetween and/or the lower and upper dielectric layers 110 and 130 may be inhibited from horizontally splitting along an interface therebetween.

Each of the semiconductor chips separated from the semiconductor substrate 100 may include the chip region 10 and the edge region 23 around the chip region 10. The lower dielectric layer 110 may extend from the chip region 10 to the edge region 23, while having a uniform thickness, and the upper dielectric layer 130 may be thinner on the edge region 23 than on the chip region 10. For example, a top surface of the second upper dielectric layer 133 may be partially exposed on the edge region 23, and the passivation layer 153 may cover a top surface of the third upper dielectric layer 135 on the chip region 10.

Figure 8:
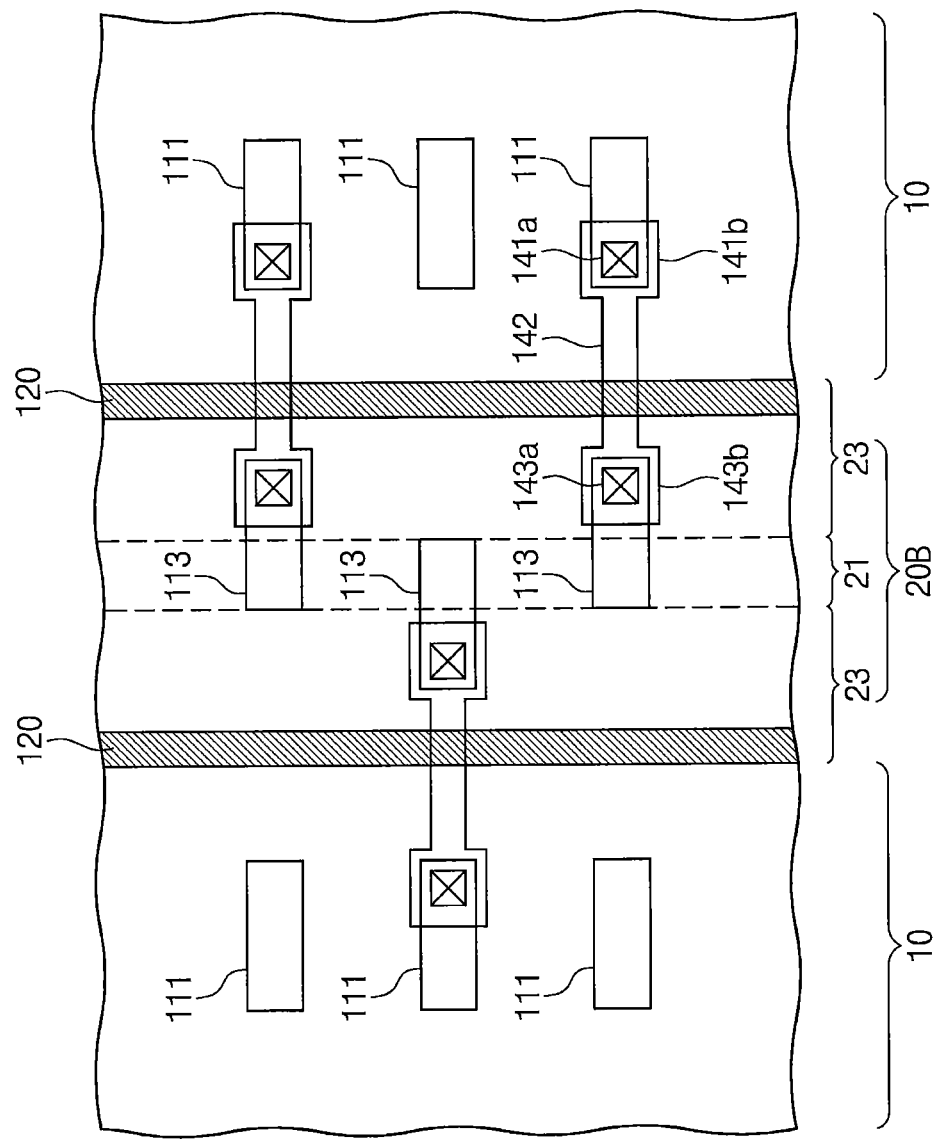
FIG. 8 illustrates an enlarged plan view partially showing a semiconductor device according to example embodiments of the present inventive concepts.
Figure 9:
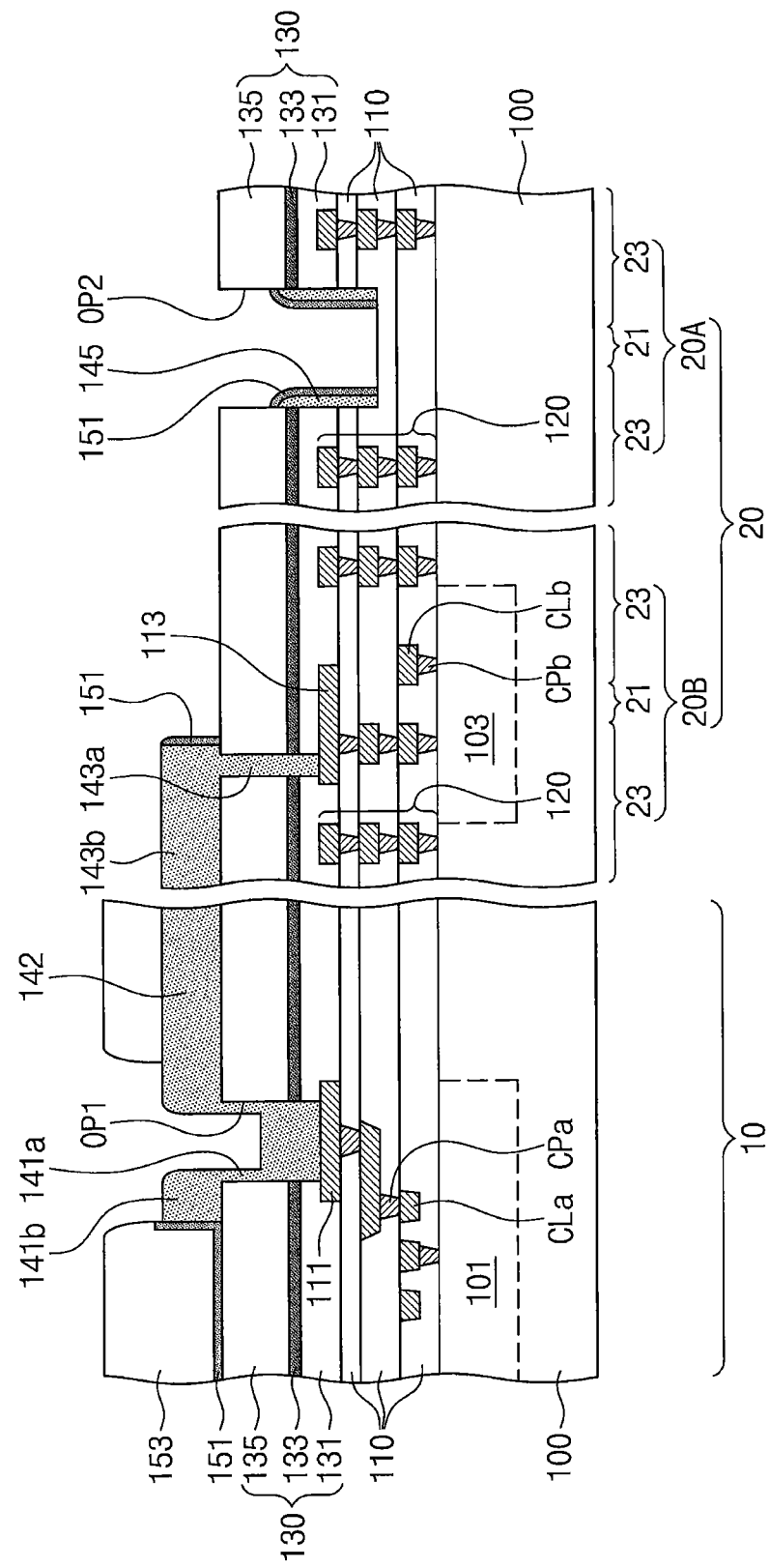
FIGS. 9 and 10 illustrate cross-sectional views showing a semiconductor device of FIG. 8.
Figure 10:
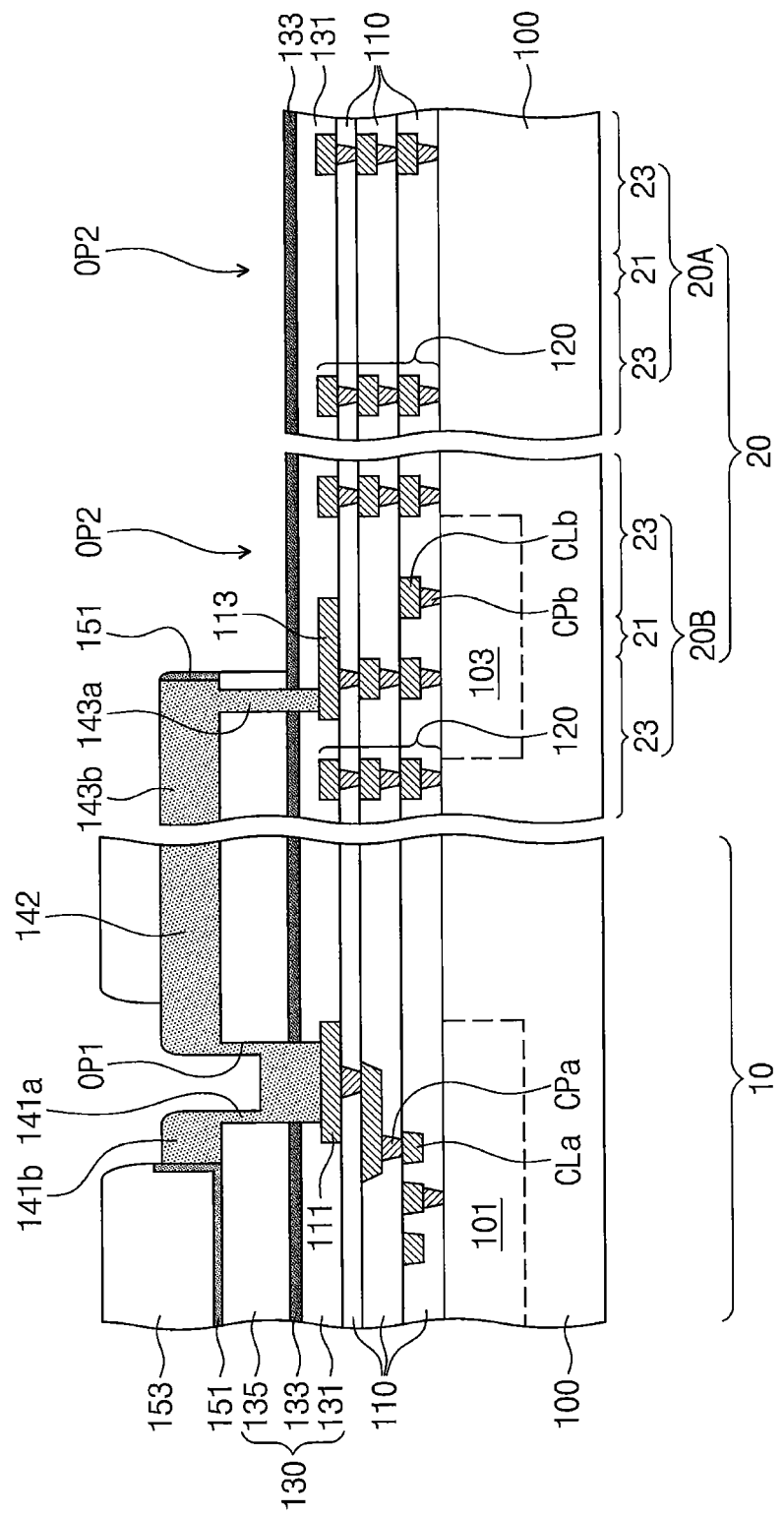

FIG. 8 illustrates an enlarged plan view partially showing a semiconductor device according to example embodiments of the present inventive concepts. FIGS. 9 and 10 illustrate cross-sectional views showing a semiconductor device of FIG. 8. The same technical features as those of the embodiments described above with reference to FIGS. 5A to 5I may be omitted in the interest of brevity of description.

In the embodiments that follow, unlike the embodiments described above, the scribe line region may include no redistribution test pads, and the redistribution chip pad of the chip region may act as a test pad during the test process.

Referring to FIGS. 8 and 9, the semiconductor substrate 100 may include the chip regions 10 and the scribe line region 20 between the chip regions 10, and the scribe line region 20 may include, as discussed above, the first scribe line region 20A where no test structures 103 are provided and the second scribe line region 20B where the test structures 103 are provided. Each of the first and second scribe line regions 20A and 20B may include the cutting region 21 that will be cut by a sawing or dicing machine and the edge regions 23 between the cutting region 21 and the chip regions 10.

The test pad 113 may be disposed on the lower dielectric layer 110 of the second scribe line region 20B, and may be electrically connected to the test structure 103 through the conductive lines CLb and the conductive plugs CPb.

The upper dielectric layer 130 may be provided on the lower dielectric layer 110 and cover the chip pad 111 and the test pad 113. The upper dielectric layer 130 may include the first opening OP1 exposing the chip pad 111 on the chip region 10 and include the second opening OP2 partially exposing the lower dielectric layer 110 on the first scribe line region 20A.

According to the present embodiments, a redistribution pattern may connect the chip pad 111 and the test pad 113 to each other. For example, the redistribution pattern may include a first redistribution via 141a coupled to the chip pad 111 on the chip region 10, a second redistribution via 143a coupled to the test pad 113 on the second scribe line region 20B, a first redistribution pad 141b connected to the first redistribution via 141a and exposed on the chip region 10, a second redistribution pad 143b connected to the second redistribution via 143a and exposed on the second scribe line region 20B, and a redistribution line 142 connecting the first and second redistribution pads 141b and 143b to each other. The redistribution pattern may be provided in plural.

The first redistribution via 141a may be formed in the first opening OP1 that penetrates the upper dielectric layer 130 on the chip region 10, and the second redistribution via 143a may penetrate the upper dielectric layer 130 on the second scribe line region 20B to thereby be coupled to the test pad 113.

The passivation layer 153 may be disposed on the upper dielectric layer 130 of the chip region 10, and may include an opening that exposes the first redistribution pad 141b. The passivation layer 153 may cover the redistribution line 142.

In some embodiments, the second redistribution vias 143a and the second redistribution pads 143b may be disposed on the edge regions 23 of the second scribe line region 20B. The second redistribution vias 143a and the second redistribution pads 143b may be arranged in a zigzag fashion along the second scribe line region 20B. In such a configuration, as described above, after the cutting process is performed on the semiconductor substrate 100, the second redistribution vias 143a and the second redistribution pads 143b may not be cut, but may remain on the edge regions 23.

As described above, the upper dielectric layer 130 may include the second opening OP2 that partially exposes the lower dielectric layer 110 on the first scribe line region 20A. For example, a thickness of the lower dielectric layer 110 exposed to the second opening OP2 may be less than a thickness of the lower dielectric layer 110 of the chip region 10. Specifically, as described above, on the edge region 23, the lower dielectric layer 110 may include a first segment having a first thickness and a second segment having a second thickness less than the first thickness.

According to other embodiments illustrated in FIG. 10, a thickness of the upper dielectric layer 130 on the first and second scribe line regions 20A and 20B may be less than a thickness of the upper dielectric layer 130 on the chip region 10 relative to the semiconductor substrate 100. For example, a top surface of the upper dielectric layer 130 on the first scribe line region 20A may be lower than a top surface of the upper dielectric layer 130 on the chip region 10. On the first and second scribe line regions 20A and 20B, the third upper dielectric layer 135 may be partially removed to expose the second upper dielectric layer 133.

Figure 11:
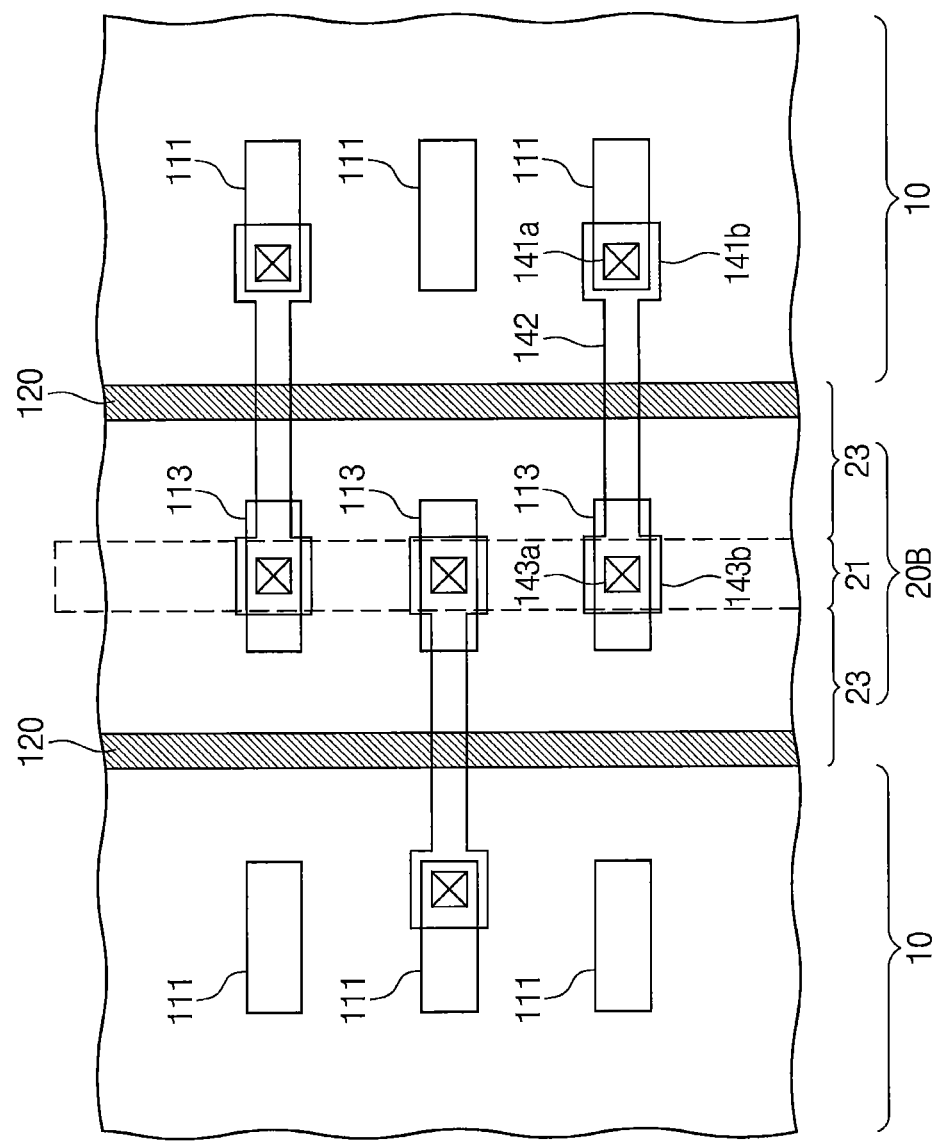
FIG. 11 illustrates an enlarged plan view partially showing a semiconductor device according to example embodiments of the present inventive concepts.
Figure 12:
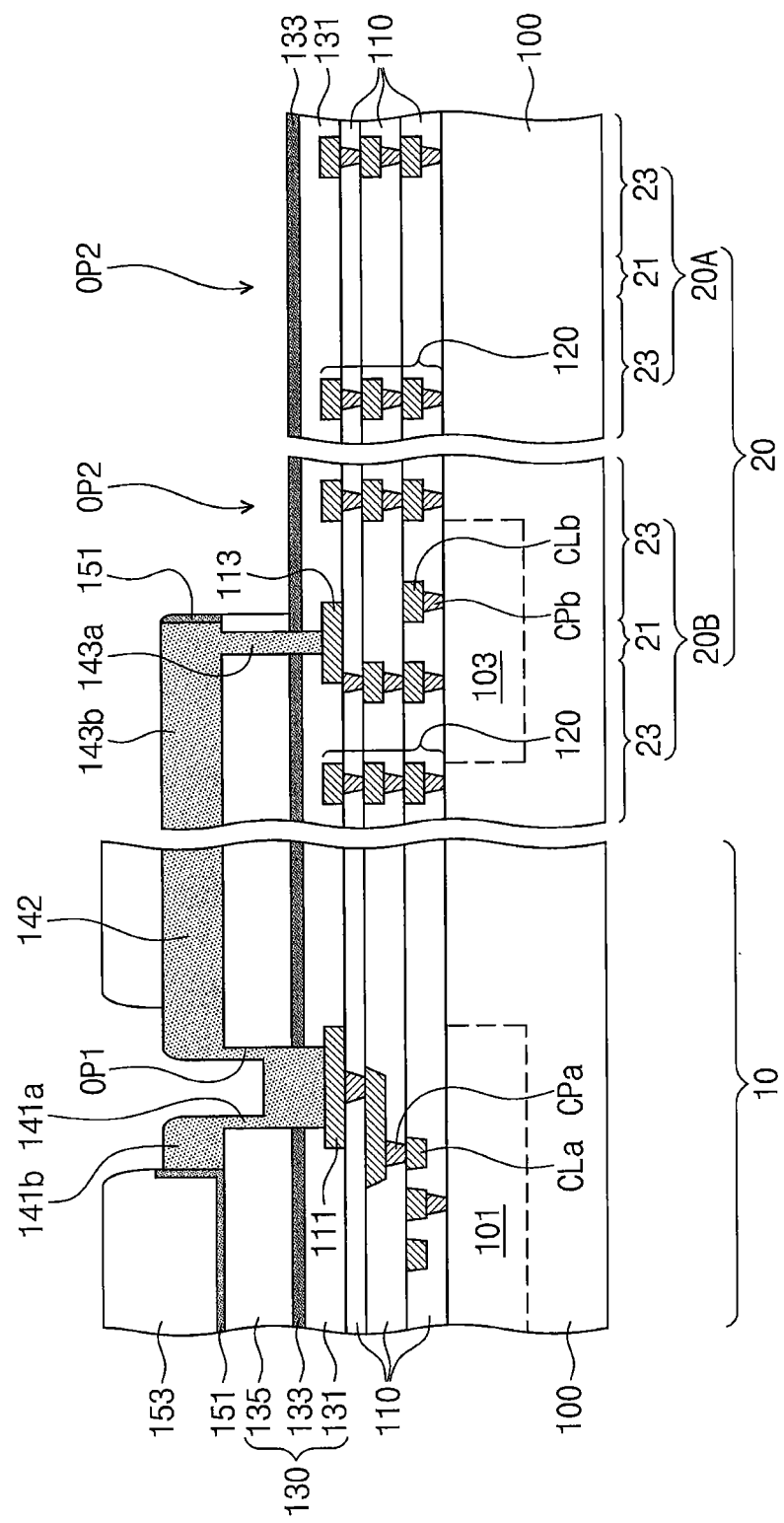
FIG. 12 illustrates a cross-sectional view showing a semiconductor device of FIG. 11.

FIG. 11 illustrates an enlarged plan view partially showing a semiconductor device according to example embodiments of the present inventive concepts. FIG. 12 illustrates a cross-sectional view showing a semiconductor device of FIG. 11. The same technical features as those of the embodiments described with reference to FIGS. 8 to 10 may be omitted in the interest of brevity of description.

Referring to FIGS. 11 and 12, the second redistribution vias 143a and the second redistribution pads 143b may be disposed in a generally straight line on the cutting region 21 of the second scribe line region 20B. As described above with reference to FIG. 10, the upper dielectric layer 130 may have a thickness smaller on the first scribe line region 20A than on the chip region 10. Alternatively, as described with reference to FIG. 9, the upper dielectric layer 130 may include the second opening OP2 that partially exposes the lower dielectric layer 110 on the first scribe line region 20A.

According to the present embodiments, because the second redistribution vias 143a and the second redistribution pads 143b are disposed on the cutting region 21, the cutting process on the semiconductor substrate 100 may cut the second redistribution vias 143a and the second redistribution pads 143b.

Figure 13:
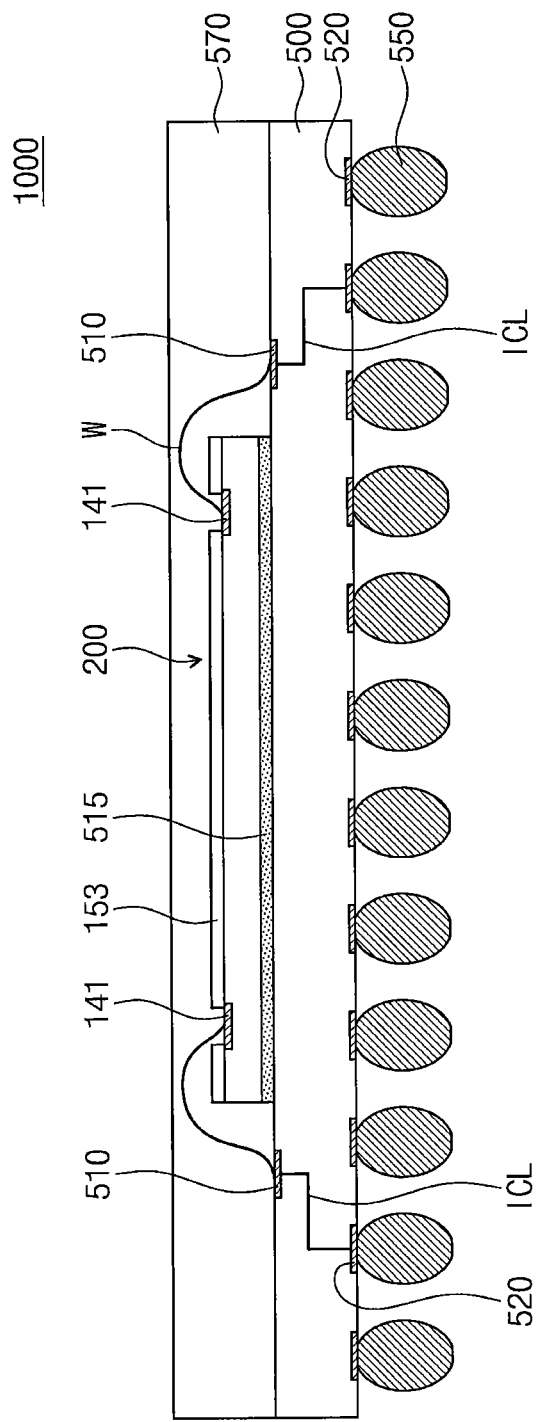
FIG. 13 illustrates a cross-sectional view showing a semiconductor package including a semiconductor device according to example embodiments of the present inventive concepts.

FIG. 13 illustrates a cross-sectional view showing a semiconductor package including a semiconductor device according to example embodiments of the present inventive concepts.

Referring to FIG. 13, a semiconductor package 1000 may include a semiconductor device 200, a package substrate 500, external connection terminals 550, and a molding layer 570. In some embodiments, the package substrate 500 may be mounted thereon with the semiconductor device (or the semiconductor chip) fabricated by the method discussed above.

The semiconductor device 200 may include, as described above, the redistribution chip pads 141 exposed by the passivation layer 153. The redistribution chip pads 141 may include data pads that communicate data signals, command/address pads that communicate command signals and address signals, and/or power and ground pads to which ground and power voltages are respectively applied.

The package substrate 500 may include, for example, a printed circuit board, a flexible substrate, and/or a tape substrate. The package substrate 500 may be one of a flexible printed circuit board, a rigid printed circuit board, and a combination thereof, each of which includes inner electric lines formed therein.

The package substrate 500 may have top and bottom surfaces facing each other, and may include bonding pads 510, inner connection lines ICL, and external connection pads 520. The bonding pads 510 may be arranged on the top surface of the package substrate 500, and the external connection pads 520 may be arranged on the bottom surface of the package substrate 500. The semiconductor device 200 may be disposed on a central portion of the top surface of the package substrate 500.

The bonding pads 510 may be connected through wires W to the redistribution chip pads 141 of the semiconductor device 200. The external connection pads 520 may be connected through the inner connection lines ICL to the bonding pads 510.

The molding layer 570 may cover the semiconductor device 200 on the top surface of the package substrate 500. The molding layer 570 may include an epoxy molding compound.

The external connection terminals 550 may be adhered to the external connection pads 520 on the bottom surface of the package substrate 500. The semiconductor package 1000 may be connected through the external connection terminals 550 to external electronic apparatus.

According to example embodiments of the present inventive concepts, insulating layers having different film characteristics may be etched on the scribe line region and, therefore, when the cutting process is performed on the semiconductor substrate, an incomplete cut of the semiconductor substrate caused by a difference in film characteristics between the lower and upper dielectric layers stacked on the scribe line region may be avoided. Moreover, thin layers may be suppressed from peeling off, and cracks may be inhibited from forming and propagating to the chip region.

Although the present invention has been described in connection with the embodiments of the present inventive concepts illustrated in the accompanying drawings, it will be understood to those skilled in the art that various changes and modifications may be made without departing from the technical spirit and essential feature of the present inventive concepts. It will be apparent to those skilled in the art that various substitution, modifications, and changes may be thereto without departing from the scope and spirit of the inventive concepts.

What is claimed is:

1. A semiconductor device, comprising:
a semiconductor substrate comprising a chip region and an edge region;
a lower dielectric layer on the semiconductor substrate;
a chip pad on the lower dielectric layer of the chip region;
an upper dielectric layer on the lower dielectric layer, the upper dielectric layer comprising a first opening exposing the chip pad on the chip region and a second opening exposing a portion of the lower dielectric layer on the edge region;
a redistribution pad connected to the chip pad, the redistribution pad comprising a via portion in the first opening and a pad portion extending from the via portion onto the upper dielectric layer;
a semiconductor integrated circuit on the chip region of the semiconductor substrate;
a test structure on the edge region of the semiconductor substrate; and
a metal line connecting the semiconductor integrated circuit and the chip pad to each other,
wherein the lower dielectric layer is on the semiconductor integrated circuit, the test structure, and the metal line, and
wherein the second opening is spaced apart from the redistribution pad.

2. The semiconductor device of claim 1, wherein the lower dielectric layer comprises a dielectric material whose dielectric constant is less than that of the upper dielectric layer.

3. The semiconductor device of claim 1, wherein, on the edge region, the lower dielectric layer comprises a first segment having a first thickness and a second segment having a second thickness less than the first thickness.

4. The semiconductor device of claim 1, wherein the lower dielectric layer has a first thickness on the chip region and a portion of the lower dielectric layer on the edge region has a second thickness, the second thickness being less than the first thickness.

5. The semiconductor device of claim 1, further comprising a redistribution spacer that is on a sidewall of the second opening and comprises a same material as that of the redistribution pad.

6. The semiconductor device of claim 1, wherein the second opening of the upper dielectric layer overlaps the test structure in a cross sectional view of the semiconductor device.

7. The semiconductor device of claim 1, wherein the upper dielectric layer comprises:
a first upper dielectric layer on the chip pad; and
second and third upper dielectric layers stacked on the first upper dielectric layer,
wherein the second upper dielectric layer comprises an insulating material different from those of the first and third upper dielectric layers.

8. The semiconductor device of claim 1, further comprising a passivation layer on the upper dielectric layer of the chip region,
wherein the passivation layer exposes a portion of the redistribution pad and a top surface of the upper dielectric layer on the edge region.

9. The semiconductor device of claim 8, further comprising a redistribution spacer that is on a sidewall of the second opening and comprises a same material as that of the redistribution pad,
wherein the passivation layer extends from the chip region to the edge region.

10. A semiconductor device, comprising:
a semiconductor substrate comprising a chip region and an edge region;
a lower dielectric layer on the semiconductor substrate;
a chip pad on the lower dielectric layer of the chip region;
an upper dielectric layer on the lower dielectric layer and on the chip pad;
a redistribution pad penetrating the upper dielectric layer and connected to the chip pad, the redistribution pad comprising a via portion in the upper dielectric layer and coupled to the chip pad and comprising a pad portion extending from the via portion onto the upper dielectric layer;
a semiconductor integrated circuit on the chip region of the semiconductor substrate;
a test structure on the edge region of the semiconductor substrate; and
a metal line connected to the semiconductor integrated circuit,
wherein the lower dielectric layer is on the semiconductor integrated circuit, the metal line, and the test structure,
wherein the upper dielectric layer comprises a recessed portion on the edge region;
wherein the recessed portion overlaps the test structure in a cross sectional view of the semiconductor device, and
wherein the recessed portion is spaced apart from the redistribution pad.

11. The semiconductor device of claim 10, wherein the lower dielectric layer comprises a dielectric material whose dielectric constant is less than that of the upper dielectric layer.

12. The semiconductor device of claim 10, further comprising a test pad on the lower dielectric layer and connected to the test structure, wherein the redistribution pad further comprises a redistribution test via that penetrates the upper dielectric layer and is connected to the test pad, and wherein the pad portion extends from the chip region to the edge region and is connected to the redistribution test via.

13. The semiconductor device of claim 10, wherein the lower dielectric layer has a first thickness on the chip region, and wherein a portion of the lower dielectric layer has a second thickness below the recessed portion relative to the semiconductor substrate, the second thickness being less than the first thickness.

14. The semiconductor device of claim 10, wherein the recessed portion has a bottom surface between a top surface of the upper dielectric layer on the chip region and a top surface of the lower dielectric layer on the chip region.

15. The semiconductor device of claim 10, wherein the upper dielectric layer comprises:

a first upper dielectric layer on the chip pad; and second and third upper dielectric layers stacked on the first upper dielectric layer, wherein the second upper dielectric layer comprises an insulating material different from those of the first and third upper dielectric layers, and wherein the recessed portion of the upper dielectric layer exposes the second upper dielectric layer.

16. The semiconductor device of claim 10, further comprising a redistribution spacer that is disposed on a sidewall of the recessed portion and comprises a same material as that of the redistribution pad.

17. The semiconductor device of claim 10, further comprising a passivation layer on the upper dielectric layer, wherein the passivation layer exposes a portion of the redistribution pad and the upper dielectric layer on the edge region.

18. The semiconductor device of claim 10, further comprising a passivation layer that is disposed on the upper dielectric layer and exposes a portion of the redistribution pad, wherein the passivation layer extends from the chip region to the edge region and is on a sidewall of the recessed portion.

* * * * *